US011183399B2

(12) United States Patent
Wei et al.

(10) Patent No.: US 11,183,399 B2
(45) Date of Patent: Nov. 23, 2021

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Wen-Hsin Wei, Hsinchu (TW); Hsien-Pin Hu, Zhubei (TW); Shang-Yun Hou, Jubei (TW); Chi-Hsi Wu, Hsinchu (TW); Chen-Hua Yu, Hsinchu (TW); Wen-Jung Chuang, Taichung (TW); Chun-Che Chen, Hsinchu (TW); Jhih-Ming Lin, Hsinchu (TW); Chih-Ching Lin, Hsinchu (TW); Shih-Wen Huang, Shuishang Township (TW); Chun Hua Chang, Zhubei (TW); Tsung-Yang Hsieh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/587,893

(22) Filed: Sep. 30, 2019

(65) Prior Publication Data

US 2020/0027750 A1 Jan. 23, 2020

Related U.S. Application Data

(62) Division of application No. 16/052,252, filed on Aug. 1, 2018.

(Continued)

(51) Int. Cl.
*H01L 33/00* (2010.01)
*H01L 21/3213* (2006.01)
(Continued)

(52) U.S. Cl.
CPC ...... *H01L 21/32139* (2013.01); *H01L 21/486* (2013.01); *H01L 21/56* (2013.01);
(Continued)

(58) Field of Classification Search
CPC . H01L 21/32139; H01L 21/486; H01L 21/56; H01L 21/561; H01L 23/28;
(Continued)

(56) References Cited

U.S. PATENT DOCUMENTS 7,316,935 B1 1/2008 Hata
8,501,587 B2 8/2013 Chen et al.
(Continued)

FOREIGN PATENT DOCUMENTS

CN 103579052 A 2/2014
CN 103579183 A 2/2014
(Continued)

*Primary Examiner* — Calvin Y Choi
(74) *Attorney, Agent, or Firm* — Slater Matsil, LLP

(57) ABSTRACT

An interposer substrate is manufactured with a scribe line between adjacent regions. In an embodiment a separate exposure reticle is utilized to pattern the scribe line. The exposure reticle to pattern the scribe line will create an exposure region which overlaps and overhangs the exposure regions utilized to form adjacent regions.

20 Claims, 20 Drawing Sheets

501
605
305
603
119
$D_3$
$W_4$
117
115
101
109
107

Related U.S. Application Data

(60) Provisional application No. 62/584,497, filed on Nov. 10, 2017.

(51) Int. Cl.

| | |
|---|---|
| ***H01L 23/00*** | (2006.01) |
| ***H01L 21/56*** | (2006.01) |
| ***H01L 23/498*** | (2006.01) |
| ***H01L 23/58*** | (2006.01) |
| ***H01L 23/28*** | (2006.01) |
| ***H01L 21/48*** | (2006.01) |
| *H01L 25/065* | (2006.01) |
| *H01L 23/31* | (2006.01) |

(52) U.S. Cl.

CPC ........ *H01L 23/28* (2013.01); *H01L 23/49822* (2013.01); *H01L 23/585* (2013.01); *H01L 24/97* (2013.01); *H01L 21/561* (2013.01); *H01L 23/3128* (2013.01); *H01L 24/11* (2013.01); *H01L 24/13* (2013.01); *H01L 25/0655* (2013.01); *H01L 2221/68331* (2013.01); *H01L 2224/0348* (2013.01); *H01L 2224/0361* (2013.01); *H01L 2224/0362* (2013.01); *H01L 2224/111* (2013.01); *H01L 2224/1132* (2013.01); *H01L 2224/1145* (2013.01); *H01L 2224/11462* (2013.01); *H01L 2224/13101* (2013.01); *H01L 2224/13111* (2013.01); *H01L 2224/16225* (2013.01); *H01L 2224/97* (2013.01); *H01L 2924/1434* (2013.01); *H01L 2924/157* (2013.01); *H01L 2924/15787* (2013.01); *H01L 2924/18161* (2013.01)

(58) Field of Classification Search

CPC ............. H01L 23/49822; H01L 23/585; H01L 23/3128; H01L 24/97; H01L 24/11; H01L 24/13; H01L 25/0655; H01L 2221/68331; H01L 2224/0348; H01L 2224/0361; H01L 2224/0362; H01L 2224/111; H01L 2224/1132; H01L 2224/1145; H01L 2224/11462; H01L 2224/13101; H01L 2224/13111; H01L 2224/16225; H01L 2224/97; H01L 2924/1434; H01L 2924/157; H01L 2924/15787; H01L 2924/18161; H01L 23/5383; H01L 23/49838–49844; H01L 23/5386; H01L 23/12–15; H01L 23/3142; H01L 21/565–566; H01L 2224/023–024; H01L 2224/02372

USPC ........................................................... 257/99

See application file for complete search history.

(56) References Cited

U.S. PATENT DOCUMENTS

| | | | | |
|---|---|---|---|---|
| 8,810,006 | B2 | 8/2014 | Yu et al. | |
| 8,866,304 | B2 | 10/2014 | Rahman et al. | |
| 9,741,669 | B2 | 8/2017 | Wei et al. | |
| 2001/0022399 | A1 | 9/2001 | Koubuchi et al. | |
| 2005/0046002 | A1 | 3/2005 | Lee et al. | |
| 2005/0136634 | A1* | 6/2005 | Savastiouk | H01L 23/49816 438/597 |
| 2005/0189636 | A1 | 9/2005 | Savastiouk et al. | |
| 2007/0068898 | A1 | 3/2007 | Lorenz | |
| 2009/0197393 | A1 | 8/2009 | Haji et al. | |
| 2009/0256931 | A1* | 10/2009 | Lee | H01L 24/97 348/231.99 |
| 2011/0156219 | A1 | 6/2011 | Kawashima et al. | |
| 2013/0069233 | A1 | 3/2013 | Chou et al. | |
| 2014/0035093 | A1 | 2/2014 | Pincu et al. | |
| 2014/0042643 | A1* | 2/2014 | Yu | H01L 23/49822 257/777 |
| 2015/0332985 | A1 | 11/2015 | Bi et al. | |
| 2015/0349022 | A1 | 12/2015 | Edwards et al. | |
| 2017/0103951 | A1* | 4/2017 | Lee | H01L 23/295 |
| 2017/0213787 | A1* | 7/2017 | Alfano | H01L 21/4846 |

FOREIGN PATENT DOCUMENTS

| | | | |
|---|---|---|---|
| CN | 103887290 | A | 6/2014 |
| CN | 106601671 | A | 4/2017 |
| CN | 106997153 | A | 8/2017 |
| KR | 100587250 | B1 | 5/2006 |

* cited by examiner 103
101
109
107
501
601
605
109
305
105
113
301
121
109
100
119
117
115

SEMICONDUCTOR DEVICE AND METHOD OF MANUFACTURE

PRIORITY CLAIM AND CROSS-REFERENCE

This application is a divisional of U.S. patent application Ser. No. 16/052,252, filed on Aug. 1, 2018, entitled "Semiconductor Device and Method of Manufacture," which claims priority to U.S. Provisional Application No. 62/584,497, filed on Nov. 10, 2017, and entitled "Semiconductor Device and Method of Manufacture," which applications are incorporated herein by reference.

BACKGROUND

The packages of integrated circuits are becoming increasing complex, with more device dies packaged in the same package to achieve more functions. For example, a package may include a plurality of device dies such as processors and memory cubes bonded to a same interposer. The interposer may be formed based on a semiconductor substrate, with through-silicon vias formed in the semiconductor substrate to interconnect the features formed on the opposite sides of the interposer. A molding compound encapsulates the device dies therein. The package including the interposer and the device dies are further bonded to a package substrate. In addition, surface mount devices may also be bonded to the substrate. A heat spreader may be attached to the top surfaces of the device dies in order to dissipate the heat generated in the device dies. The heat spreader may have a skirt portion fixed onto the package substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
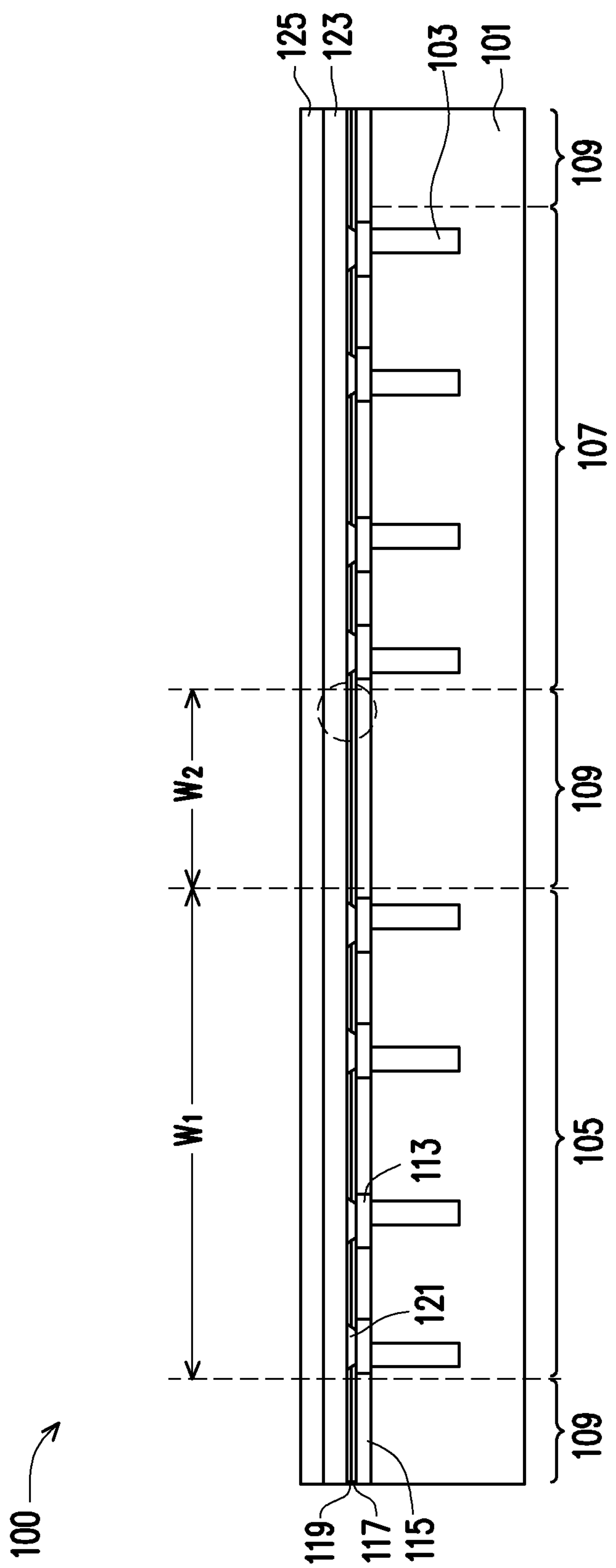
FIGS. 1A-1D illustrate an interposer substrate with a redistribution layer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment in which an extra overhang mask is utilized to overcome the maximum reticle die size in a chip on wafer on substrate (CoWoS) 3DIC package.

With reference now to FIGS. 1A-1D, illustrated therein is a process of formation for an interposer 100 formed with an active overhang of photolithographic exposure regions. In the embodiment illustrated, the interposer 100 comprises an interposer substrate 101 with through substrate vias (TSVs) 103 at least partially formed therein. The interposer substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The interposer substrate 101 may be divided into a first interposer region 105 and a second interposer region 107. In an embodiment the first interposer region 105 is designed to attach to and provide electrical connections for a first plurality of semiconductor devices (e.g., a first semiconductor device 701, a second semiconductor device 703, and a third semiconductor device 705, not illustrated in FIGS. 1A-1B but illustrated and described below with respect to FIG. 7A).

To accommodate the first semiconductor device 701, the second semiconductor device 703, and the third semiconductor device 705, the first interposer region 105 may be formed to have a first width $W_1$. In some embodiments the first width $W_1$ may be formed to coincide with a maximum usable exposure width of a first patterned mask 155 (not illustrated in FIG. 1A but illustrated and discussed further below with respect to FIG. 1B). For example, the first width $W_1$ may be larger than zero but less than about 33 mm. However, any suitable width may be utilized.

The second interposer region 107 may be similar to the first interposer region 105. For example, the second interposer region 107 is designed to attach to and provide electrical connections for a second plurality of semiconductor devices (e.g., a fourth semiconductor device 707, a fifth semiconductor device 709, and a sixth semiconductor device 711, not illustrated in FIG. 1A but illustrated and discussed further below with respect to FIG. 7A). Additionally, the second interposer region 107 is located and spaced separately from the first interposer region 105, but which may still use the same first photolithographic mask 155 as the first interposer region 105. As such, the second interposer region 107 will also have the first width $W_1$, although it may also have a separate width if a separate lithographic mask different from the first patterned mask 155 is desired to be utilized.

The first interposer region 105 may be separated from the second interposer region 107 by a scribe region 109. In an embodiment the scribe region 109 is a separate region which separates the first interposer region 105 from the second interposer region 107, and may allow for a later singulation between the first interposer region 105 and the second interposer region 107. In other embodiments the scribe region 109 may be patterned in order to provide additional structural support (using, e.g., dummy materials) or else providing additional electrical connections that may be used for testing but not for usage in the final product. Finally, the scribe region 109 also helps to allow for adjustment of size between the chosen semiconductor devices (e.g., the first semiconductor device 701, the second semiconductor device 703, and the third semiconductor device 705) without requiring a full redesign of the different photolithographic masks Additionally, the scribe region 109 may be formed using a fifth patterned mask 503 (not illustrated in FIGS. 1A-1D but illustrated and discussed further below with respect to FIG. 5B). By utilizing a fifth patterned mask 503 (instead of merely relying on the sizing of the first patterned mask 155), the width of the scribe region 109 may be increased to provide for the desired overhang beyond the width that could be achieved without the use of the fifth patterned mask 503. For example, the scribe region 109 may have a second width $W_2$ of about 1,400 μm. However, any suitable width may be utilized.

Within the interposer substrate 101, the TSVs 103 may be formed to extend through the interposer substrate 101 so as to provide a quick passage of data signals from a first side of the interposer substrate 101 to a second side of the interposer substrate 101. In an embodiment the TSVs 103 may be formed by initially forming through silicon via (TSV) openings into the interposer substrate 101. The TSV openings may be formed by applying and developing a suitable photoresist, and removing portions of the interposer substrate 101 that are exposed to the desired depth. The TSV openings may be formed so as to extend into the interposer substrate 101 to a depth greater than the eventual desired height of the interposer substrate 101. Accordingly, while the depth is dependent upon the overall designs, the depth may be between about 20 μm and about 200 μm, such as a depth of about 50 μm.

Once the TSV openings have been formed within the interposer substrate 101, the TSV openings may be lined with a liner. The liner may be, e.g., an oxide formed from tetraethylorthosilicate (TEOS) or silicon nitride, although any suitable dielectric material may alternatively be used. The liner may be formed using a plasma enhanced chemical vapor deposition (PECVD) process, although other suitable processes, such as physical vapor deposition or a thermal process, may alternatively be used. Additionally, the liner may be formed to a thickness of between about 0.1 μm and about 5 μm, such as about 1 μm.

Once the liner has been formed along the sidewalls and bottom of the TSV openings, a barrier layer may be formed and the remainder of the TSV openings may be filled with first conductive material. The first conductive material may comprise copper, although other suitable materials such as aluminum, alloys, doped polysilicon, combinations thereof, and the like, may alternatively be utilized. The first conductive material may be formed by electroplating copper onto a seed layer, filling and overfilling the TSV openings. Once the TSV openings have been filled, excess liner, barrier layer, seed layer, and first conductive material outside of the TSV openings may be removed through a planarization process such as chemical mechanical polishing (CMP), although any suitable removal process may be used.

Once the TSV openings have been filled, a first redistribution layer 113 may be formed in physical and/or electrical connection with the TSVs 103. In an embodiment the first redistribution layer 113 may be formed by initially forming a seed layer of a titanium copper alloy through a suitable formation process such as CVD or sputtering. A photoresist may then be formed to cover the seed layer, and the photoresist may then be patterned to expose those portions of the seed layer that are located where the first redistribution layer 113 is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm. However, while the material and methods discussed are suitable to form the conductive material, these materials are merely exemplary. Any other suitable materials, such as AlCu or Au, and any other suitable processes of formation, such as CVD or PVD, may alternatively be used to form the first redistribution layer 113.

Once the conductive material has been formed, the photoresist may be removed through a suitable removal process such as chemical stripping and/or ashing. Additionally, after the removal of the photoresist, those portions of the seed layer that were covered by the photoresist may be removed through, for example, a suitable etch process using the conductive material as a mask.

Once the first redistribution layer 113 has been formed, a series of dielectric layers may be formed to cover and overlie the first redistribution layer 113. In an embodiment the series of dielectric layer comprises a first dielectric layer 115, a second dielectric layer 117 overlying the first dielectric layer 115, and a third dielectric layer 119 overlying the second dielectric layer 117. The first dielectric layer 115 may be a dielectric material such as silicon oxide, silicon nitride, silicon oxynitride, a low-k dielectric, combinations of these or the like, and may be formed by a deposition process such as chemical vapor deposition (CVD), physical vapor deposition (PVD), atomic layer deposition (ALD), or the like.

The second dielectric layer 117 may overlie the first dielectric layer 115 and may serve as, e.g., an etch stop layer. In an embodiment the second dielectric layer 117 may be a dielectric material different from the first dielectric layer 115, such as silicon nitride, silicon oxide, silicon oxynitride, low-k dielectrics, combinations, of these, or the like, and may also be formed by a deposition process such as CVD, PVD, ALD, or the like.

The third dielectric layer 119 may overlie the second dielectric layer 117. In an embodiment the third dielectric layer 119 may be a dielectric material similar to the first dielectric layer 115, such as silicon oxide, silicon nitride, silicon oxynitride, low-k dielectrics, combinations, of these, or the like, and may also be formed by a deposition process such as CVD, PVD, ALD, or the like.

Once the third dielectric layer 119 and the second dielectric layer 117 have been formed, at least the third dielectric layer 119 and the second dielectric layer 117 are patterned in order to expose portions of the first redistribution layer 113. In an embodiment, the third dielectric layer 119 and the second dielectric layer 117 may be patterned by initially applying a photoresist to the third dielectric layer 119 and the second dielectric layer 117 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the third dielectric layer 119 and the second dielectric layer 117 are removed with, e.g., one or more dry etch processes, and then the photoresist can be removed. However, any other suitable method for patterning the third dielectric layer 119 and the second dielectric layer 117 to expose the underlying first redistribution layer 113 may be utilized.

Once the third dielectric layer 119 and the second dielectric layer 117 have been patterned, vias 121 may be formed in contact with the first redistribution layer 113. In an embodiment one or more barrier layers may be formed to line the openings through the third dielectric layer 119 and the second dielectric layer 117, a seed layer may be deposited, and the openings through the third dielectric layer 119 and the second dielectric layer 117 are filled with a conductive material such as copper, although any suitable material may be utilized. Once filled, portions of the conductive material outside of the openings is removed using a planarization process, such as a chemical mechanical planarization process.

Once the vias 121 have been formed, a conductive layer 123 is blanket deposited over the third dielectric layer 119 and in contact with the vias 121 such that the conductive layer 123 covers each of the first interposer region 105, the second interposer region 107, and each of the scribe regions 109. In an embodiment the conductive layer 123 is a conductive material such as aluminum, although other suitable materials, such as an aluminum copper alloy, copper, tungsten, or the like, may be utilized. The conductive layer 123 may be formed using a process such as CVD or PVD, although other suitable materials and methods may be utilized.

Once the conductive layer 123 has been deposited over each of the first interposer region 105, the second interposer region 107, and each of the scribe regions 109, the conductive layer 123 is patterned to form a series of contact pads 301 (not illustrated as complete in FIG. 1A, but illustrated below with respect to FIG. 3). In an embodiment the conductive layer 123 may be patterned by placing a first photoresist 125 over the conductive layer 123 and patterning the first photoresist 125. For example, the first photoresist 125 is either a single layer of photosensitive material or else, in another embodiment, is a tri-layer photoresist, with a bottom anti-reflective coating (BARC) layer, an intermediate mask layer, and a top photoresist layer. However, any suitable type of photosensitive material or combination of materials may be utilized.

Figure 1B:
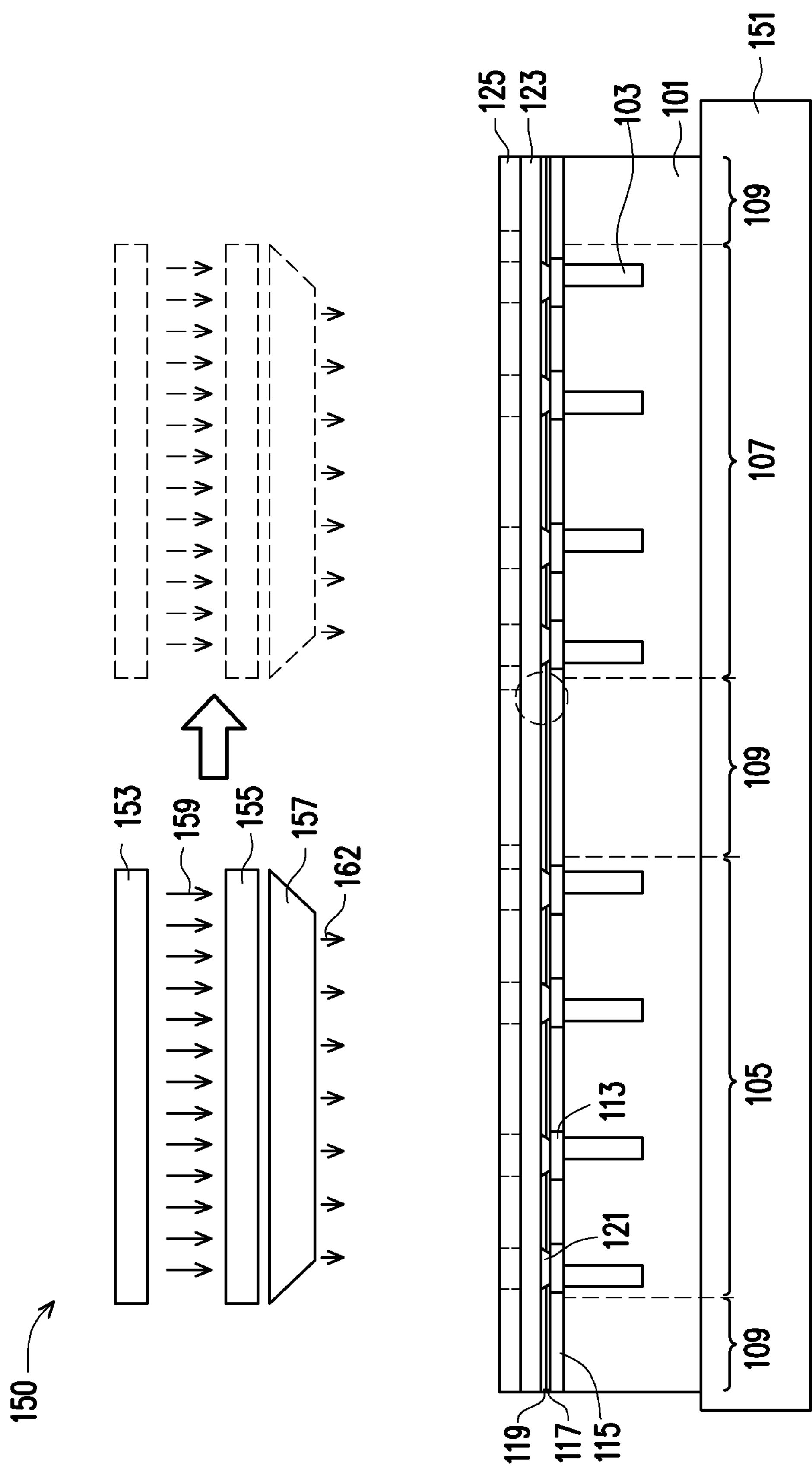

FIG. 1B illustrates an imaging of the first photoresist 125 within the first interposer region 105. Once applied, the first photoresist 125 may be exposed to form a region to be removed (e.g., one of an exposed region or an unexposed region) and a region to not be removed (e.g., the other one of the exposed region or the unexposed region) within the first photoresist 125, wherein the separate regions are denoted by dashed lines. In an embodiment the exposure may be initiated by placing the interposer substrate 101 and the first photoresist 125 into an imaging device 150 for exposure. The imaging device 150 may comprise a support plate 151, an energy source 153, a first patterned mask 155 between the support plate 151 and the energy source 153, and optics 157. In an embodiment the support plate 151 is a surface to which the interposer substrate 101 and the first photoresist 125 may be placed or attached to and which provides support and control to the interposer substrate 101 during exposure of the first photoresist 125. Additionally, the support plate 151 may be movable along one or more axes, as well as providing any desired heating or cooling to the interposer substrate 101 and first photoresist 125 in order to prevent temperature gradients from affecting the exposure process.

In an embodiment the energy source 153 supplies energy 159 such as light to the first photoresist 125 in order to induce a reaction of the PACs, which in turn reacts with, e.g., the photosensitive portion of the first photoresist 125 to chemically alter those portions of the first photoresist 125 to which the energy 159 impinges. In an embodiment the energy 159 may be electromagnetic radiation, such as g-rays (with a wavelength of about 436 nm), i-rays (with a wavelength of about 365 nm), ultraviolet radiation, far ultraviolet radiation, x-rays, electron beams, or the like. The energy source 153 may be a source of the electromagnetic radiation, and may be a KrF excimer laser light (with a wavelength of 248 nm), an ArF excimer laser light (with a wavelength of 193 nm), a F2 excimer laser light (with a wavelength of 157 nm), or the like, although any other suitable source of energy 159, such as mercury vapor lamps, xenon lamps, carbon arc lamps or the like, may alternatively be utilized.

The first patterned mask 155 is located between the energy source 153 and the first photoresist 125 in order to block portions of the energy 159 to form a patterned energy 162 prior to the energy 159 actually impinging upon the first photoresist 125. In an embodiment the first patterned mask 155 may comprise a series of layers (e.g., substrate, absorbance layers, anti-reflective coating layers, shielding layers, etc.) to reflect, absorb, or otherwise block portions of the energy 159 from reaching those portions of the first photoresist 125 which are not desired to be illuminated. The desired pattern may be formed in the first patterned mask 155 by forming openings through the first patterned mask 155 in the desired shape of illumination.

Optics (represented in FIG. 1B by the trapezoid labeled 157) may be used to concentrate, expand, reflect, or otherwise control the energy 159 as it leaves the energy source 153, is patterned by the first patterned mask 155, and is directed towards the first photoresist 125. In an embodiment the optics 157 comprise one or more lenses, mirrors, filters, combinations of these, or the like to control the energy 159 along its path. Additionally, while the optics 157 are illustrated in FIG. 1B as being between the first patterned mask 155 and the first photoresist 125, elements of the optics 157 (e.g., individual lenses, mirrors, etc.) may also be located at any location between the energy source 153 (where the energy 159 is generated) and the first photoresist 125.

In an embodiment the interposer substrate 101 with the first photoresist 125 is placed on the support plate 151. Once the pattern has been aligned to the interposer substrate 101, the energy source 153 generates the desired energy 159 (e.g., light) which passes through the first patterned mask 155 and the optics 157 on its way to the first photoresist 125. The patterned energy 162 impinging upon portions of the first photoresist 125 induces a reaction of photoactive compounds (PACs) within the first photoresist 125. The chemical reaction products of the PACs' absorption of the patterned energy 162 (e.g., acids/bases/free radicals) then react, chemically altering the first photoresist 125 in those portions that were illuminated through the first patterned mask 155.

Optionally, the exposure of the first photoresist 125 may occur using an immersion lithography technique. In such a technique an immersion medium may be placed between the imaging device 150 (and particularly between a final lens of the optics 157) and the first photoresist 125. With this immersion medium in place, the first photoresist 125 may be patterned with the patterned energy 162 passing through the immersion medium.

FIG. 1B additionally illustrates that, because the first patterned mask 155 has a maximum width above which its resolution is unacceptable (e.g., a maximum width of about 33 mm), the imaging device 150 can only expose a portion of the first photoresist 125, such as a portion of the first photoresist 125 within the first interposer region 105 in the view of FIG. 1B (a second portion of the first photoresist 125 not in the view of FIG. 1B is exposed as described below with respect to FIGS. 2A-2C). As such, once the first photoresist 125 has been exposed within the first interposer region 105, the image device 150 will move either the optics or the interposer substrate 101 so that a second portion of the first photoresist 125, such as that portion of the first photoresist 125 within the second interposer region 107, can be exposed by the imaging device 150. In a particular embodiment the imaging device 150 may perform a step and scan process, whereby the relative position of the interposer substrate 101 and the optics 157 are changed by moving either the support plate 151 (which would also move the interposer substrate 101), by moving the optics 157, or by moving both, such that the patterned energy 162 will impinge upon the first photoresist 125 located within the second interposer region 107.

Figure 1C:
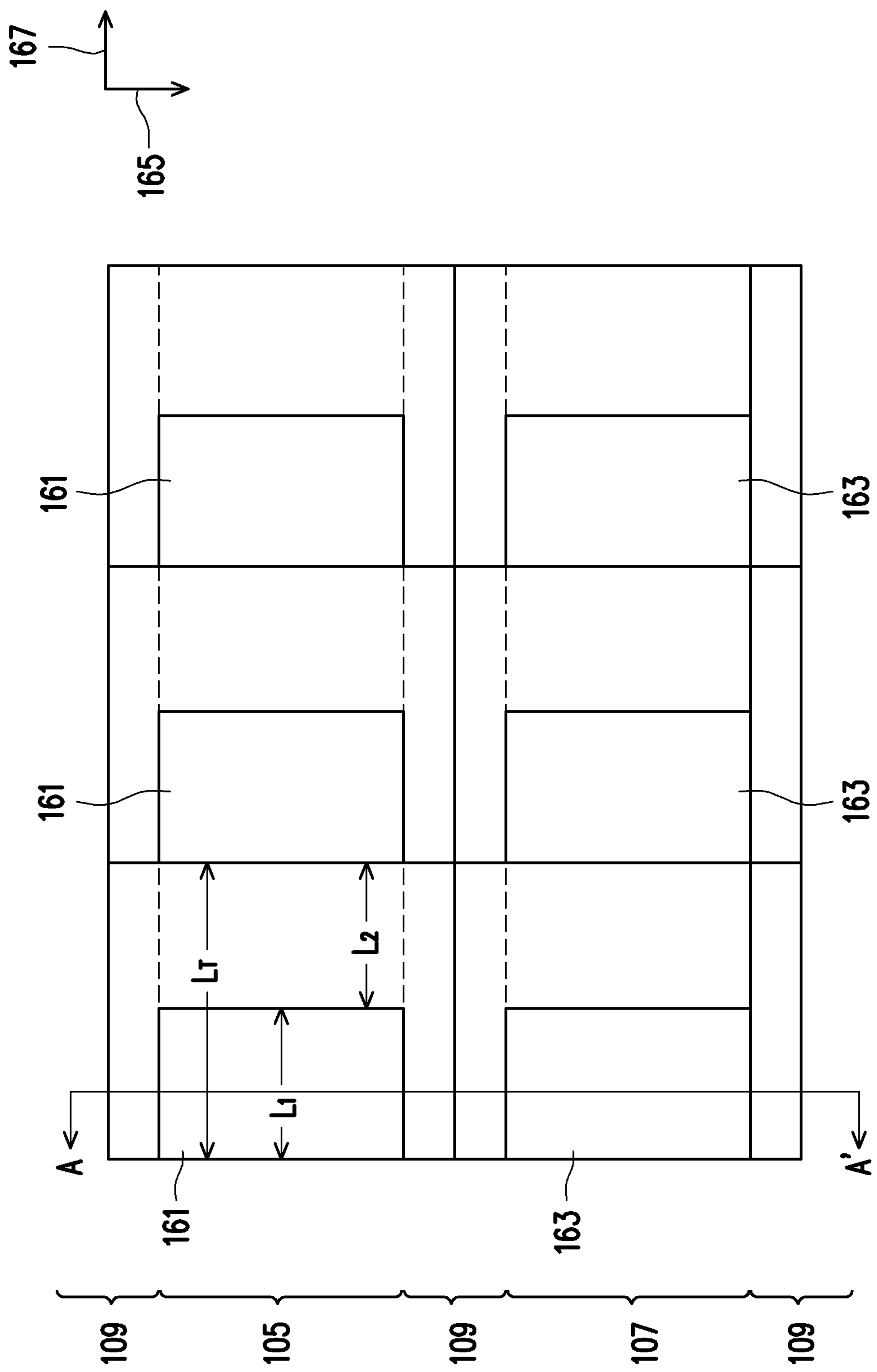

FIG. 1C illustrates a top-down view of a pattern that may be utilized to step and scan the first photoresist 125 with the first patterned mask 155, wherein FIGS. 1A-1B illustrate a cross-sectional view of FIG. 1C along line A-A'. In this embodiment, the first patterned mask 155 is utilized to step and scan a first exposure region 161 within the first interposer region 105, wherein the first exposure region 161 has the first width $W_1$ at the upper limit of the first patterned mask 155. Additionally, the first exposure region 161 will also have a first length $L_1$ that is also less than the exposure limits of the first patterned mask 155, such as by being less than 33 mm, such as between about 21.5 mm and about 33 mm, such as about 26 mm. However, any suitable length may be utilized.

Additionally, FIG. 1C also illustrates the step-and-scan process whereby the first patterned mask 155 also creates a second exposure region 163 within the second interposer region 107 in a first direction (represented in FIG. 1C by the arrow labeled 165). As illustrated, the first patterned mask 155 is used to generate the second exposure region 163 and, as such, the second exposure region 163 has the same pattern as the first exposure region 161, such as having the first width $W_1$ and the first length $L_1$, although the second exposure region 163 may be different in other embodiments.

FIG. 1C additionally illustrates that the pattern is extended along with the interposer substrate 101 to form a two-dimensional pattern of the first exposure region 161 and the second exposure region 163. Each of the first exposure region 161 and the second exposure region 163 may be separated from other ones of the first exposure region 161 and the second exposure region 163 by a distance sufficient to allow for another exposure (represented in FIG. 1C using dashed lines and further illustrated and discussed below with respect to FIGS. 2A-2C) from a second patterned mask 201 (not illustrated in FIG. 1C but illustrated and described further below with respect to FIG. 2B). For example, in the second direction 167, a first one of the first exposure regions 161 may be separated from a second one of the first exposure regions 161 by a second length $L_2$ of less than the exposure limit of the second patterned mask 201, such as less than about 33 mm, such as about 21.5 mm. This results in a total length $L_T$ of between about 43 mm and 52 mm.

Figure 1D:
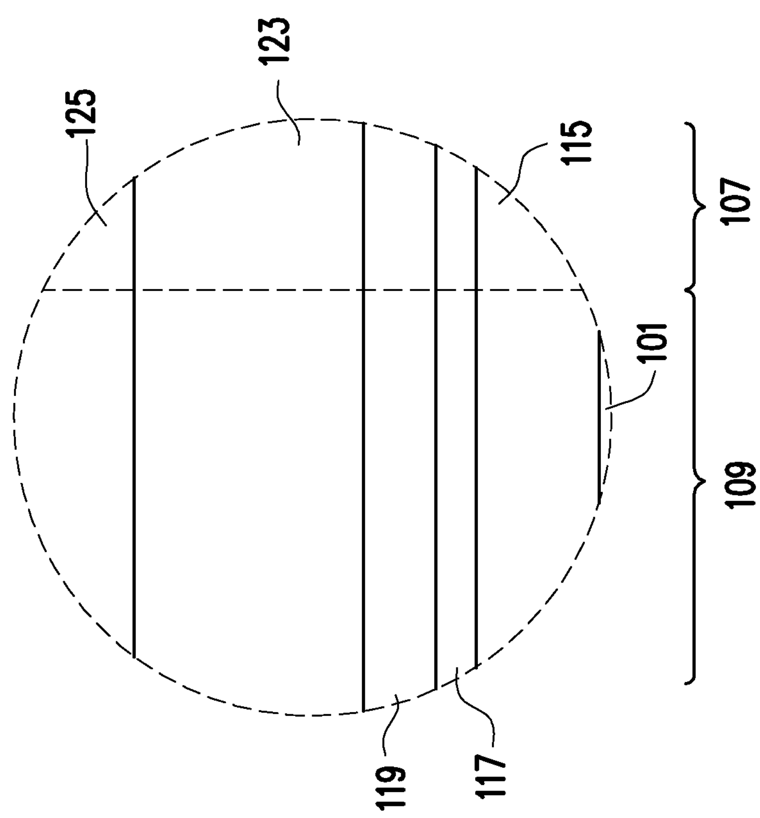

FIG. 1D illustrates a close-up view of the dashed circle in FIG. 1A. As can be seen in this close-up view, the first dielectric layer 115, the second dielectric layer 117, and the third dielectric layer 119 overlie the interposer substrate 101. Further, the conductive layer 123 overlies the third dielectric layer 119 and the first photoresist 125 overlies the conductive layer 123. Each of these layers extends into both the scribe region 109 as well as the second interposer region 107.

Figure 2A:
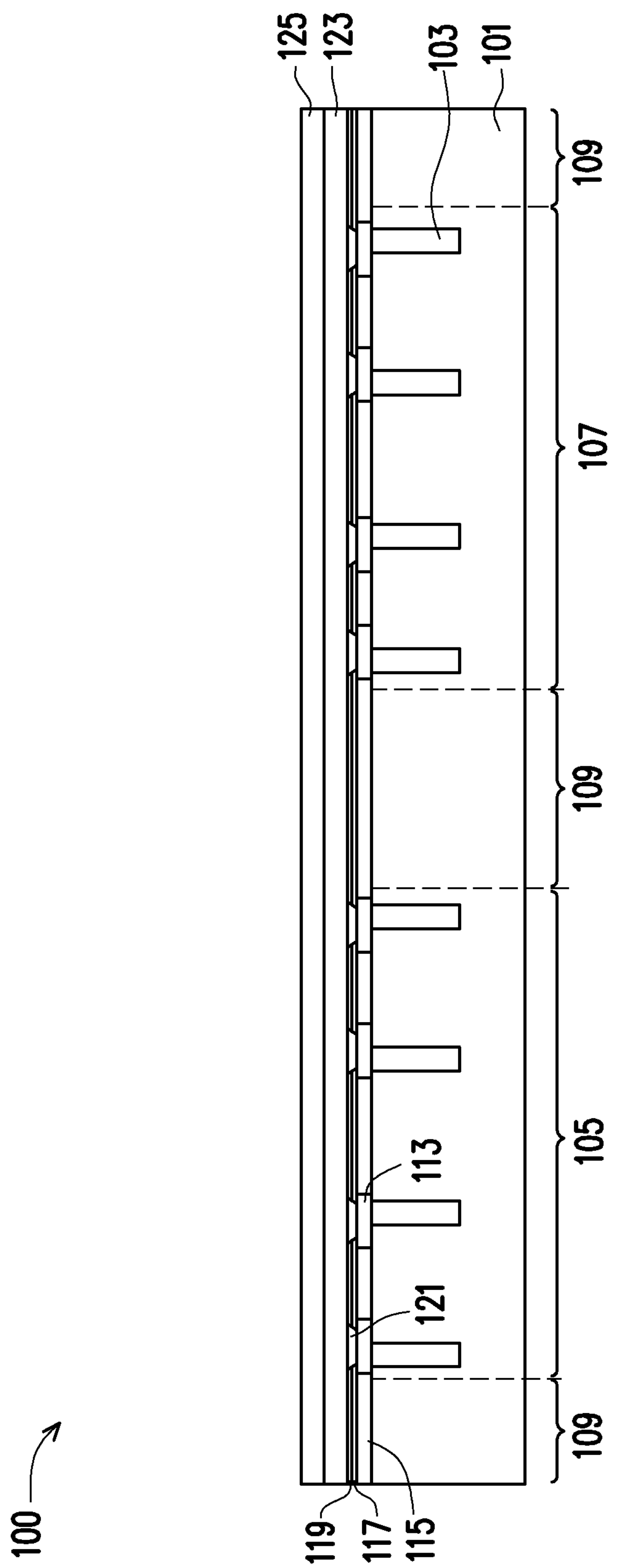
FIGS. 2A-2C illustrate a patterning of a first photoresist to form a first exposure region, in accordance with some embodiments.
Figure 2B:
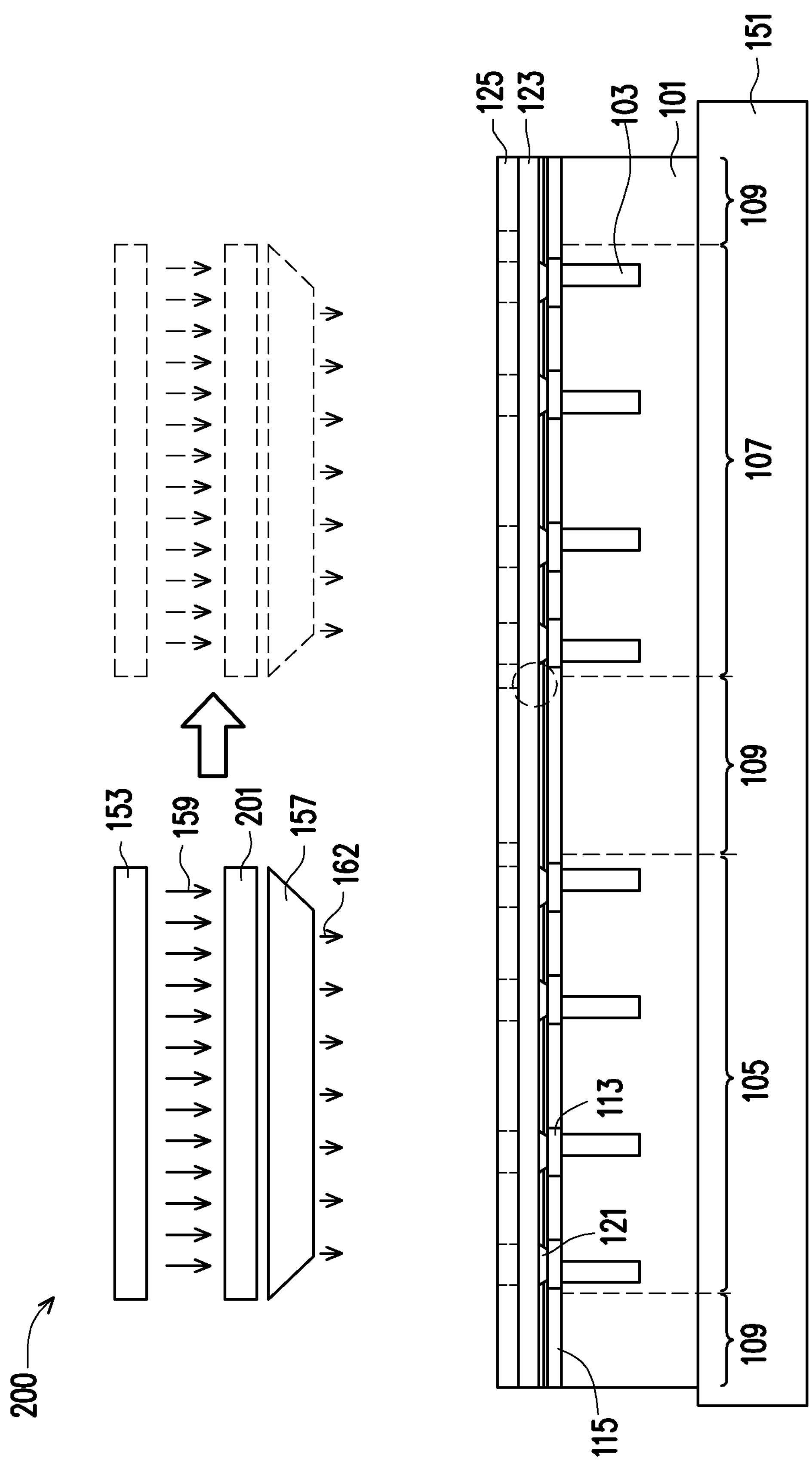
Figure 2C:
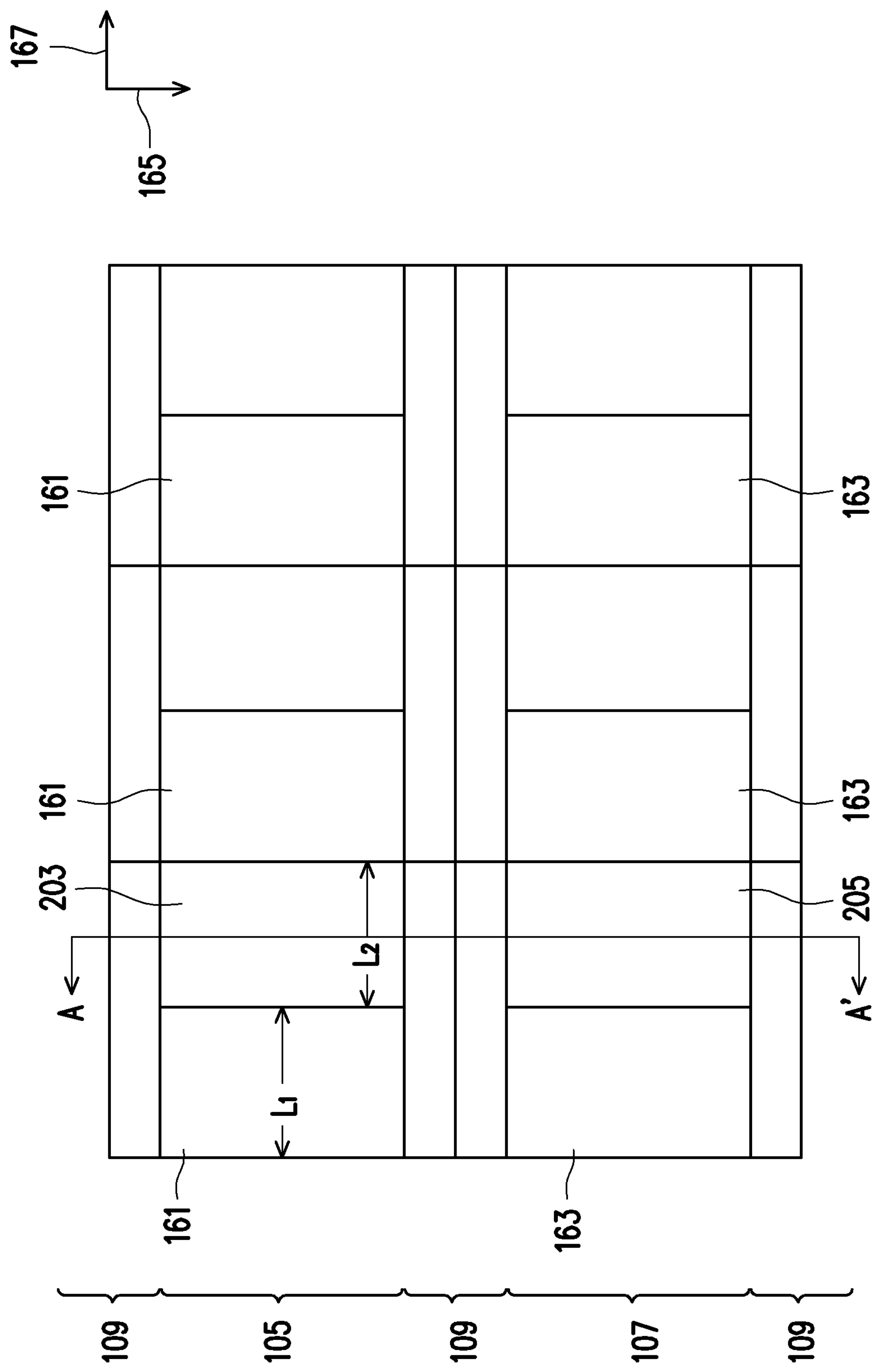

FIGS. 2A-2C illustrate the use of a second patterned mask 201 (see, e.g., FIG. 2B) to form a third exposure region 203 (see, e.g., FIG. 2C). FIG. 2A illustrates a cross-sectional view of the interposer substrate 101 along line A-A' in FIG. 2C, which is outside of either the first exposure region 161 and the second exposure region 163 (see FIGS. 1A-1D), prior to imaging.

Similar to the discussion above with respect to FIGS. 1A-1D, FIG. 2B illustrates that the second patterned mask 201 may be placed into an imaging device 200 while the interposer substrate 101 is placed onto a support plate 151. Once in place, the imaging device 200 uses a step-and-scan approach to image the third exposure region 203 and the fourth exposure region 205, wherein separate exposed and unexposed regions are denoted by dashed lines. In an embodiment the interposer substrate 101 may be removed from the imaging device 150 with the first patterned mask 155 and placed into a second, separate imaging device 200 which includes the second patterned mask 201.

FIG. 2C illustrates that, after the second patterned mask 201 is utilized, the first exposure region 161 and the third exposure region 203 collectively provide the full pattern for a first interposer. Similarly, FIG. 2C also illustrates that the second patterned mask 201 forms a fourth exposure region 205, wherein the second exposure region 163 and the fourth exposure region 205 collectively provide the fully pattern for a second interposer.

Figure 3:
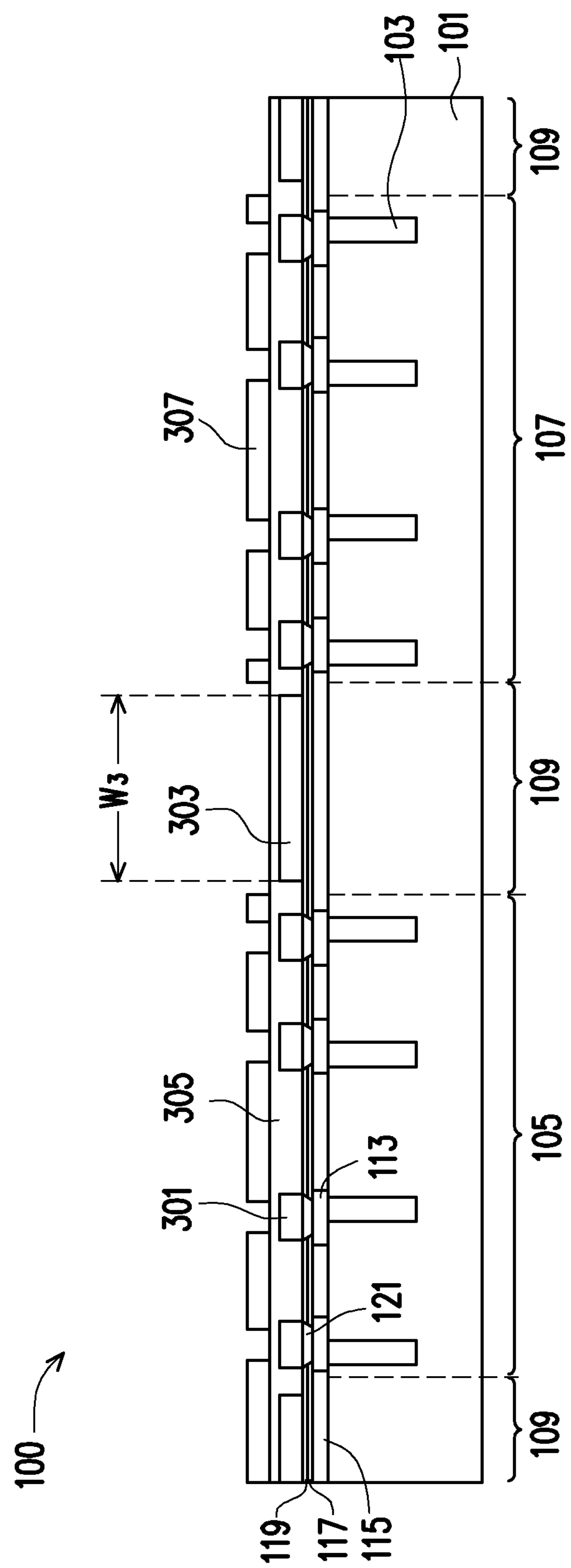
FIG. 3 illustrates deposition of a passivation layer in accordance with some embodiments.

FIG. 3 illustrates that, once the first exposure regions 161, the second exposure regions 163, the third exposure regions 203 and the fourth exposure regions 205 have been exposed, the first photoresist 125 (see, e.g., FIGS. 1B and 2B) is developed using a first developer. In an embodiment the first developer can be utilized to remove either the exposed portion or unexposed portions of the first photoresist 125, and may be, e.g., an organic solvent or a basic aqueous solution. Further, in embodiments in which the first photoresist 125 is a tri-layer photoresist, once the photosensitive portions of the first photoresist 125 have been developed, a dry etching process may be utilized to extend the developed pattern through the bottom anti-reflective coating (BARC) layer and the intermediate mask layer.

FIG. 3 additionally illustrates that, once the first photoresist 125 in FIGS. 1B and 2B has been developed, the conductive layer 123 (see, e.g., FIGS. 1B and 2B) may be patterned using the first photoresist 125 as a mask to form contact pads 301. In an embodiment the conductive layer 123 can be patterned using a dry etching process such as a reactive ion etch, whereby etchants selective to the material to be patterned (e.g., the conductive layer 123) are directed towards the conductive layer 123 masked by the first photoresist 125. Upon contact with exposed portions of the conductive layer 123, the etchants react and remove only the exposed portions, leaving behind those portions covered by the first photoresist 125. However, any suitable process may be utilized.

Additionally, because the first patterned mask 155 was utilized to pattern the first photoresist 125 only within the first interposer region 105 and the second interposer region 107, a first portion 303 of the conductive layer 123 within each of the scribe regions 109 remains after the patterning of the conductive layer 123 and may have a third width $W_3$ of about 1320 μm. If left as a continuous layer, the first portion 303 can create problems such as wafer arcing in further processes.

Once the first photoresist 125 has been utilized to form the contact pads 301, the first photoresist 125 may be removed. In an embodiment the first photoresist 125 may be removed using, e.g., an ashing process, whereby the temperature of the first photoresist 125 is increased until the first photoresist 125 undergoes a thermal decomposition, after which the first photoresist 125 may be easily removed. However, any suitable process, such as a wet strip, may be utilized.

FIG. 3 also illustrates the placement of a first passivation layer 305 over the contact pads 301 and the first portion 303. The first passivation layer 305 may be made of one or more suitable dielectric materials such as polybenzoxazole (PBO), although any suitable material, such as polyimide or a polyimide derivative, may alternatively be utilized. The first passivation layer 305 may be placed using, e.g., a spin-coating process to a thickness of between about 5 μm and about 25 μm, such as about 7 μm, although any suitable method and thickness may alternatively be used.

Once the first passivation layer 305 has been placed, the first passivation layer 305 may be patterned to expose the contact pads 301. In an embodiment the first passivation layer 305 may be patterned using a similar process as described above with respect to FIGS. 1A-2B. For example, a second photoresist 307 (which may be, e.g., a tri-layer photoresist as described above) may be placed over the first passivation layer 305.

Once the second photoresist 307 has been placed, the second photoresist 307 is patterned. In an embodiment the second photoresist 307 may be patterned in a similar fashion as described above with respect to the patterning of the first photoresist 125 in FIGS. 1A-2C. For example, the interposer substrate 101 may be placed into the imaging device 150 and/or the imaging device 200, whereby a third patterned mask and a fourth patterned mask are utilized to step-and-scan the desired pattern into the second photoresist 307. Once the second photoresist 307 has been exposed, the second photoresist 307 is developed and, in an embodiment in which the second photoresist 307 is a tri-layer photoresist, a dry etching process may be utilized to extend the developed pattern through the bottom anti-reflective coating (BARC) layer and the intermediate mask layer.

Figure 4:
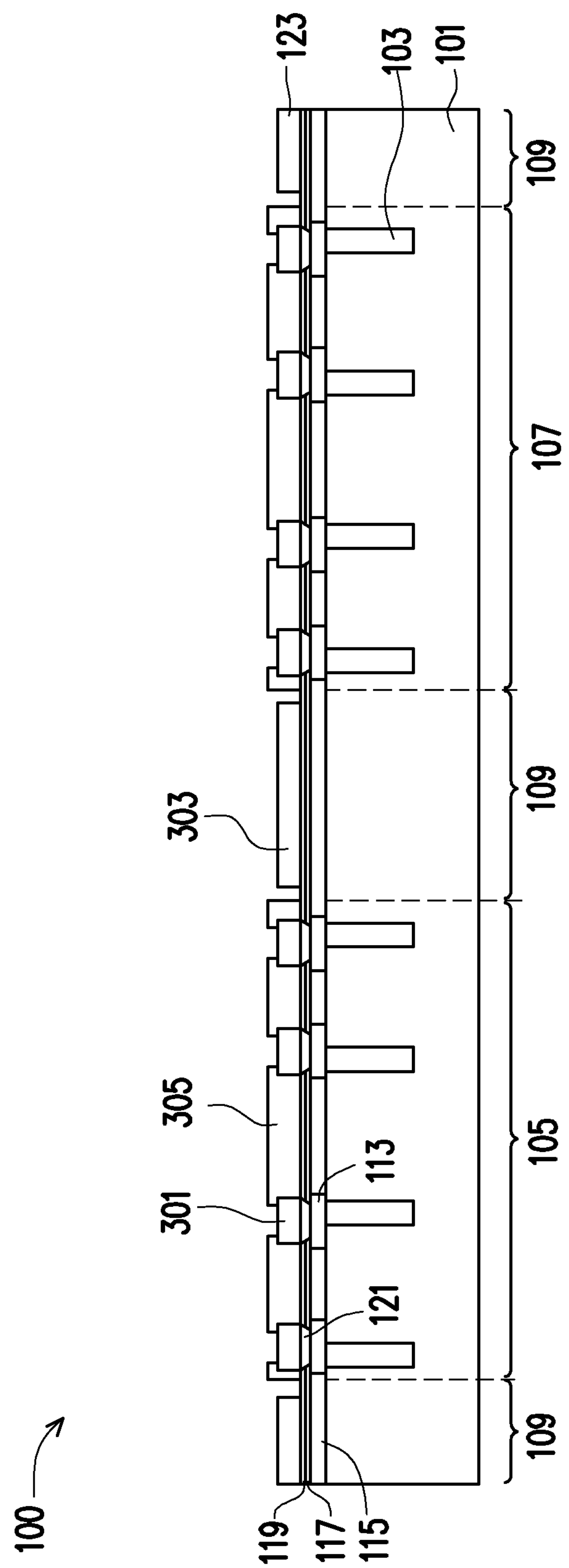
FIG. 4 illustrates a patterning of the passivation layer in accordance with some embodiments.

FIG. 4 illustrates that, once the second photoresist 307 has been patterned, the pattern may be transferred to the first passivation layer 305. In an embodiment the pattern of the second photoresist 307 may be transferred using, e.g., an anisotropic etching process such as a reactive ion etch process, whereby etchants selective to the material to be patterned (e.g., the first passivation layer 305) are directed towards the first passivation layer 305 masked by the second photoresist 307. Upon contact with exposed portions of the first passivation layer 305, the etchants react and remove only the exposed portions, leaving behind those portions covered by the second photoresist 307. However, any suitable process may be utilized.

Additionally, because the second photoresist 307 was not patterned within the scribe regions 109, the second photoresist 307 within the scribe regions 109 is removed. As such, the material of the first passivation layer 305 within the scribe regions is fully exposed during the transferal of the pattern from the second photoresist 307 to the first passivation layer 305. Because of this, the material of the first passivation layer 305 is fully removed from over the first portion 303 of the conductive layer 123 located within the scribe regions 109, thereby exposing either in full or in part the first portion 303 of the conductive layer 123 located within the scribe regions 109.

Once the second photoresist 307 has been utilized to pattern the first passivation layer 305, the second photoresist 307 may be removed. In an embodiment the second photoresist 307 may be removed using, e.g., an ashing process, whereby the temperature of the second photoresist 307 is increased until the second photoresist 307 undergoes a thermal decomposition, after which the second photoresist 307 may be easily removed. However, any suitable process, such as a wet strip, may be utilized.

Figure 5A:
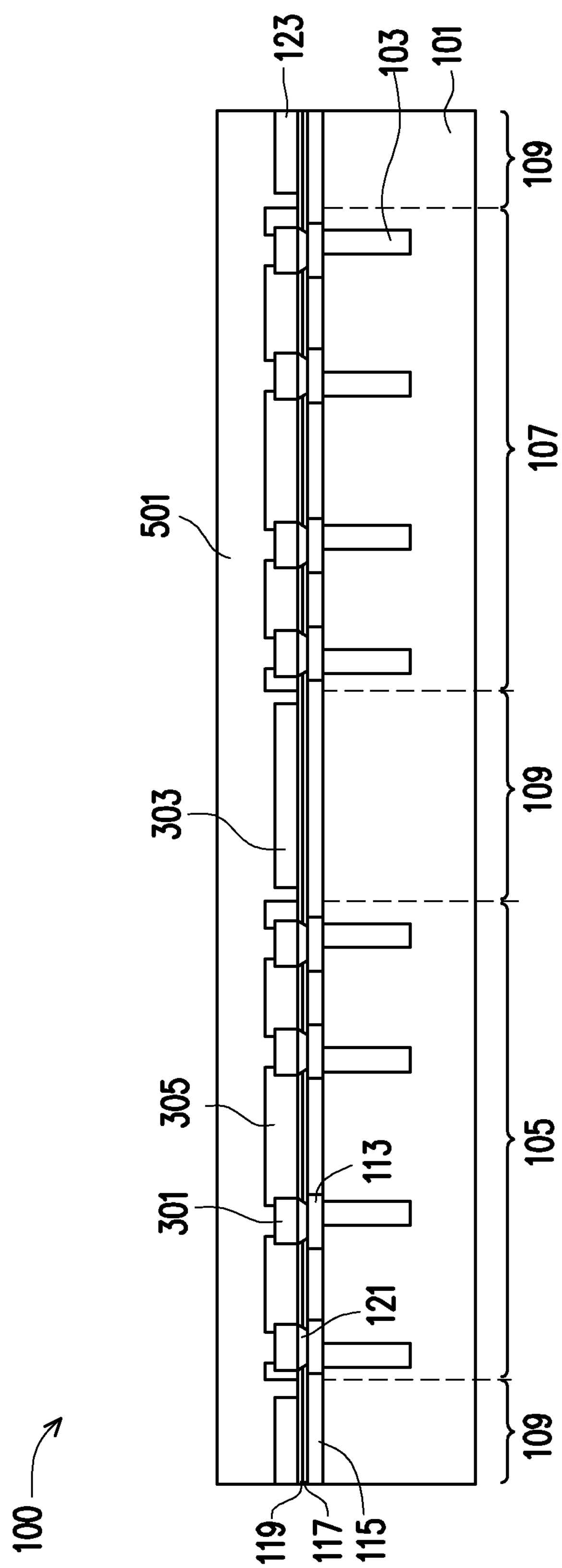
FIGS. 5A-5C illustrate an exposure of a scribe region in accordance with some embodiments.
Figure 5B:
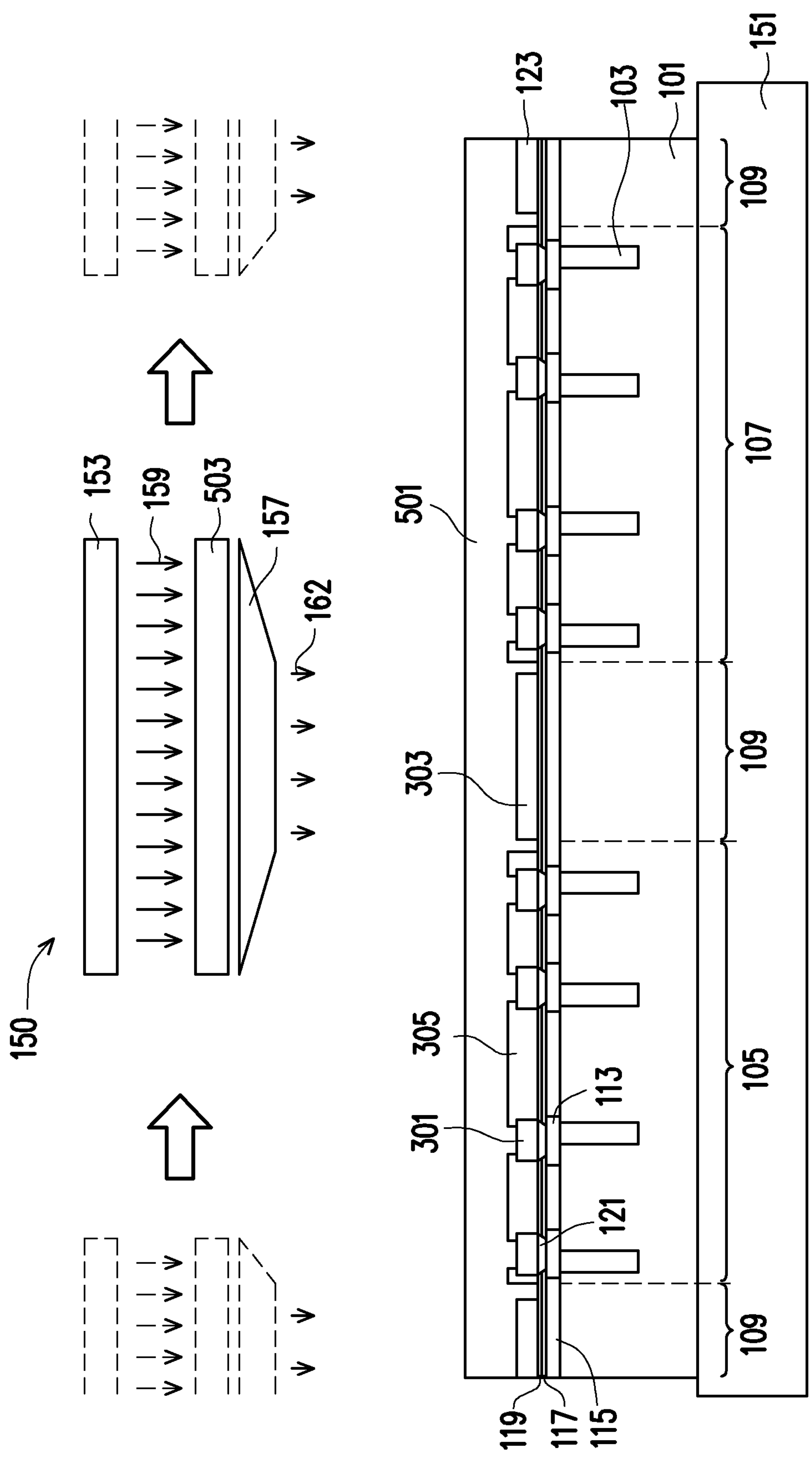
Figure 5C:
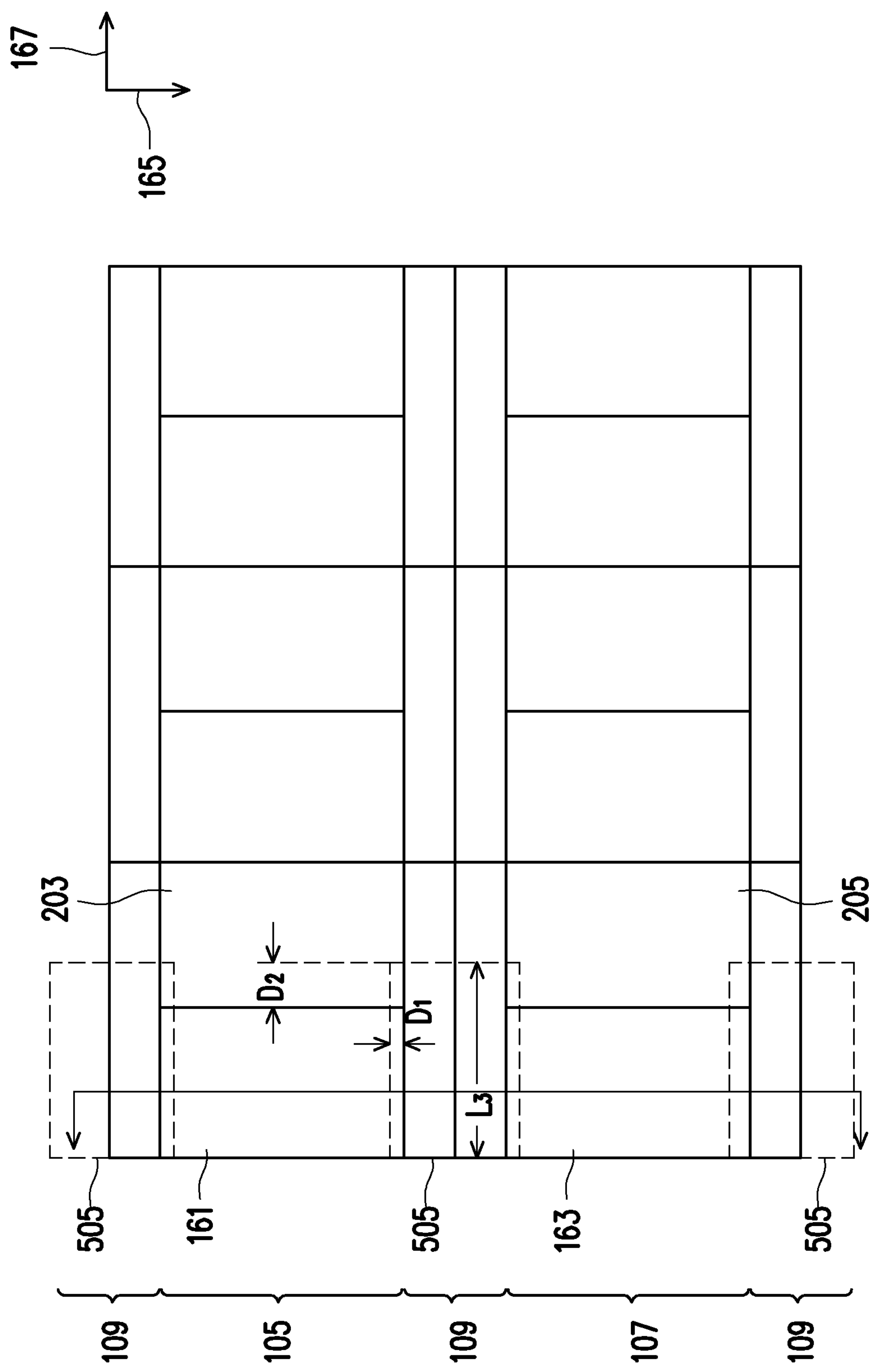

FIGS. 5A-5C illustrate a patterning of the conductive layer 123 within the scribe regions 109. Looking first at FIG. 5A, in an embodiment the patterning of the conductive layer 123 may be performed by applying a third photoresist 501 over the interposer substrate 101. In an embodiment the third photoresist 501 may be similar to the first photoresist 125, such as by being a single or tri-layer photoresist, and may be applied using, e.g., a spin on process whereby the third photoresist 501 covers the entire interposer substrate 101, including both the first interposer region 105, the second interposer region 107, and each of the scribe regions 109.

FIG. 5B illustrates that, once the third photoresist 501 has been placed, the third photoresist 501 may be patterned into exposed and unexposed regions, wherein the separate regions are denoted by dashed lines. In an embodiment the third photoresist 501 is patterned by placing the interposer substrate 101 with the third photoresist 501 into the imaging device 150, wherein a fifth patterned mask 503 is utilized instead of the first patterned mask 155 or the second patterned mask 201. In an embodiment the fifth patterned mask 503 is a mask specifically designed for the scribe regions 109 and, as such, is a different mask with a different pattern than the first patterned mask 155, the second patterned mask 201, the third patterned mask, or the fourth patterned mask.

Additionally, FIG. 5B also illustrates that the imaging device 150 exposes a single scribe region 109 at a time in a step- and scan process. For example, as described above with respect to FIG. 1B, the imaging device 150 may utilize a step-and-scan approach to expose separate portions of the scribe regions 109 one at a time and in a sequential order. However, any suitable method of exposing multiple ones of the scribe regions 109 may be utilized.

FIG. 5C illustrates a top-down view of fifth exposure regions 505 created using the fifth patterned mask 503 within the scribe regions 109 over the interposer substrate 101. As can be seen, the imaging device 150 with the fifth patterned mask 503 is utilized to pattern the third photoresist 501 within the scribe regions 109 with minimal overlap between the first exposure region 161, the second exposure region 163 and the fifth exposure regions 505. In particular, if desired, the imaging device 150 with the fifth patterned mask 503 can form the fifth exposure regions 505 such that the fifth exposure regions 505 overlap a portion of either the first exposure region 161 or the second exposure region 163. In an embodiment the fifth exposure region 505 may overlap the first exposure region 161 by a first distance $D_1$ of about 2.5 μm. However, any suitable distance may be utilized.

Optionally, in some of the embodiments, the fifth exposure region 505 may also overlap not only the first exposure region 161 and the second exposure region 163, but also overlap the third exposure region 203 and the fourth exposure region 205. In this embodiment the fifth exposure region 505 may have a third length $L_3$ that is greater than the first length $L_1$ and less than the total length $L_T$, and may extend over the third exposure region 203 and the fourth exposure region 205 a second distance $D_2$ of less than the second length $L_2$. However, any suitable distances and overlaps may be utilized.

Once the third photoresist 501 has been exposed, the third photoresist 501 is developed using, e.g., a second developer. In an embodiment the second developer can be utilized to remove either the exposed portion or unexposed portions of the third photoresist 501, and may be, e.g., an organic solvent or a basic aqueous solution. Further, in an embodiment in which the third photoresist 501 is a tri-layer photoresist, once the third photoresist 501 has been developed, a dry etching process may be utilized to extend the developed pattern through the bottom anti-reflective coating (BARC) layer and the intermediate mask layer.

In an embodiment the third photoresist 501 is exposed and developed in order to fully cover the first interposer region 105 and the second interposer region 107. Additionally, the third photoresist 501 is also exposed and developed in order to fully or partially expose the first portion 303 of the conductive layer 123.

Figure 6A:
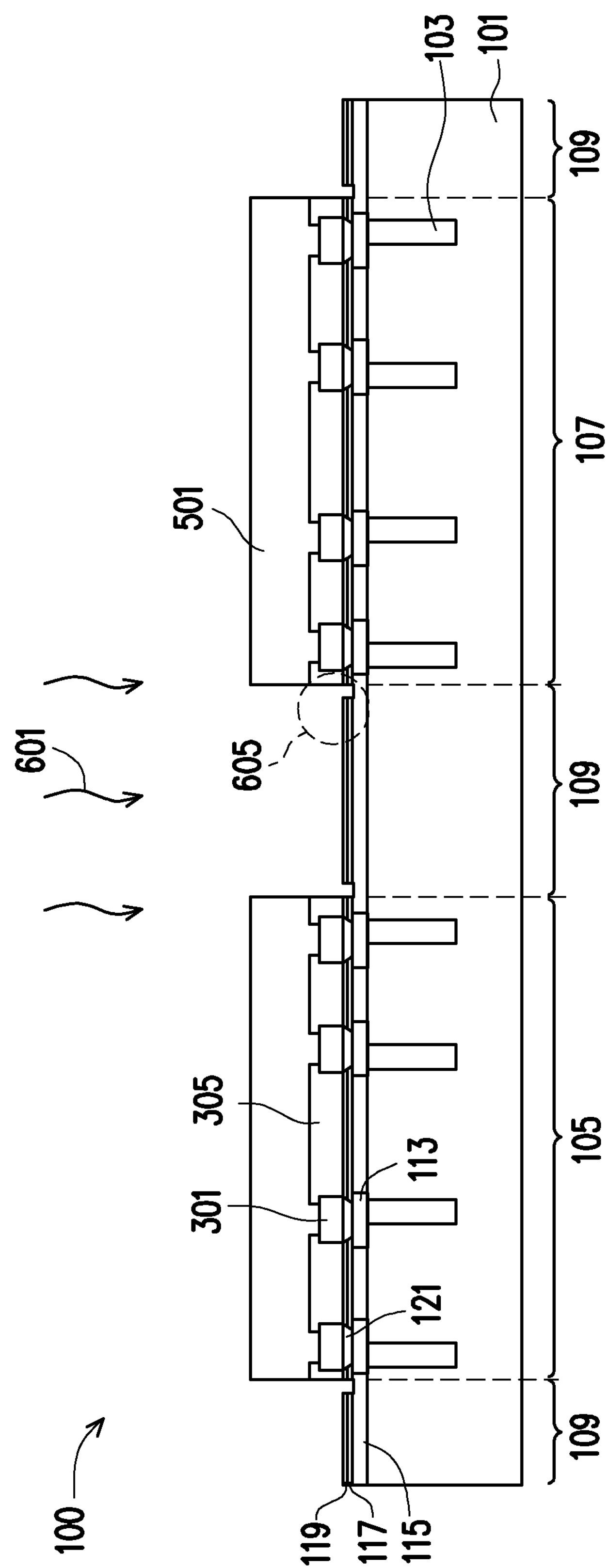
FIGS. 6A-6B illustrate a first etching process in accordance with some embodiments.
Figure 6B:
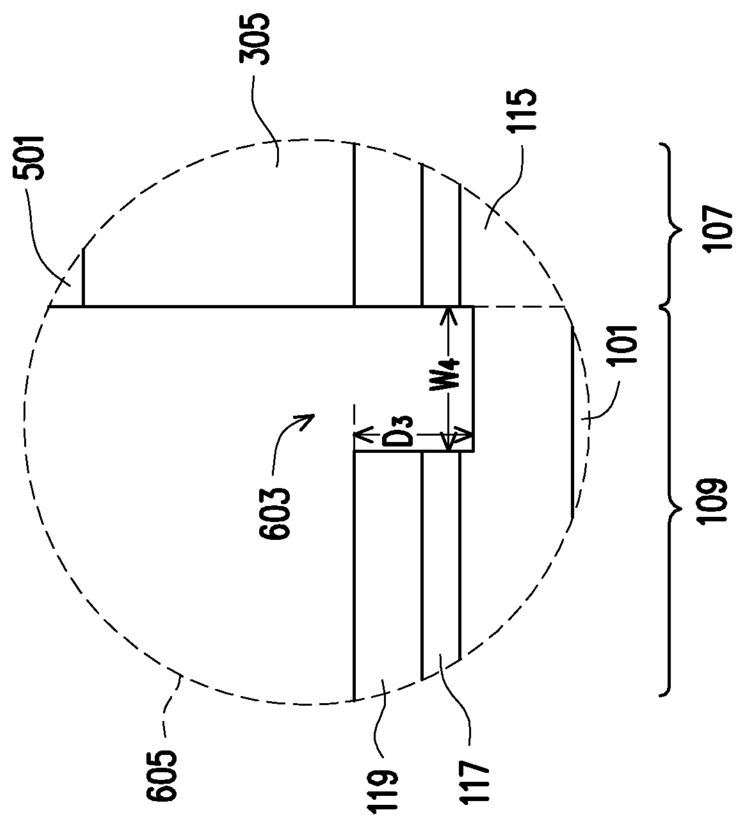

FIGS. 6A-6B illustrate that, once the third photoresist 501 has been applied, exposed, and developed, the pattern of the third photoresist 501 may be transferred to the underlying layers using a first etching process (represented in FIG. 6A by the arrows labeled 601). In an embodiment the first etching process 601 may be an anisotropic etch, such as a reactive ion etch with etchants that are selective towards the material of the conductive layer 123 shown in FIG. 5B. However, any suitable transferal process may be utilized.

In an embodiment in which the third photoresist 501 is fully removed from the entire scribe regions 109, the first etching process 601 will fully remove the exposed first portion 303 of the conductive layer 123 shown in FIG. 5B that is located within the scribe regions 109. By removing the conductive layer 123, the conductive layer 123 is not present during subsequent processing steps and damage that may otherwise occur (e.g., wafer arcing) can be avoided.

Additionally, while the etchants of the first etching process 601 are selective towards the material of the conductive layer 123, this selectivity may or may not be complete. In embodiments in which the selectivity is not complete, those portions of the first dielectric layer 115, the second dielectric layer 117, and/or the third dielectric layer 119 that do not underlie the exposed conductive layer 123 or the third photoresist 501 (e.g., that portion that is located between the first portion 303 of the conductive layer 123 and the first passivation layer 305) may also be etched by the first etching process 601. As such, an overetch (seen in the dashed box labeled 605) of the first dielectric layer 115, the second dielectric layer 117, and/or the third dielectric layer 119 may occur.

FIG. 6B illustrates a close-up view of the dashed box 605 in FIG. 6A, and illustrates a close-up view of the structure of the first dielectric layer 115, the second dielectric layer 117, and/or the third dielectric layer 119, after the first etching process 601. As can be seen, the first etching process 601 creates a first opening 603 which extends into the third dielectric layer 119, the second dielectric layer 117, and, if deep enough, the first dielectric layer 115. In a particular embodiment the first opening 603 may extend from a top surface of the third dielectric layer 119 a third distance $D_3$ that is at least as large as the combined thickness of both the third dielectric layer 119 and the second dielectric layer 117, although any suitable distance may be utilized.

Similarly, the first opening 603 may have a fourth width $W_4$ that stretches from the second interposer region 107 (as illustrated in FIG. 6B) to a position aligned with where the first portion 303 of the conductive layer 123 had been located prior to the first etching process 601. As such, a first sidewall of the first opening 603 may be aligned with the first passivation layer 305, while a second sidewall of the first opening 603 may be aligned with the sidewall of the first portion 303 of the conductive layer 123 shown in FIG. 5B (which has been removed). In a particular embodiment the fourth width $W_4$ is about 1.5 μm. However, any suitable width may be utilized.

Of course, while an embodiment is described above in which the first portion 303 is a conductive layer overlying dielectric layers, this is intended merely to be illustrative and is not intended to be limiting upon the embodiments. Rather, any suitable combination of materials, such as a dielectric layer overlying conductive layers, dielectric layers overlying dielectric layers, or the like may also be utilized. All suitable combination of materials are fully intended to be included within the scope of the embodiment.

Figure 7A:
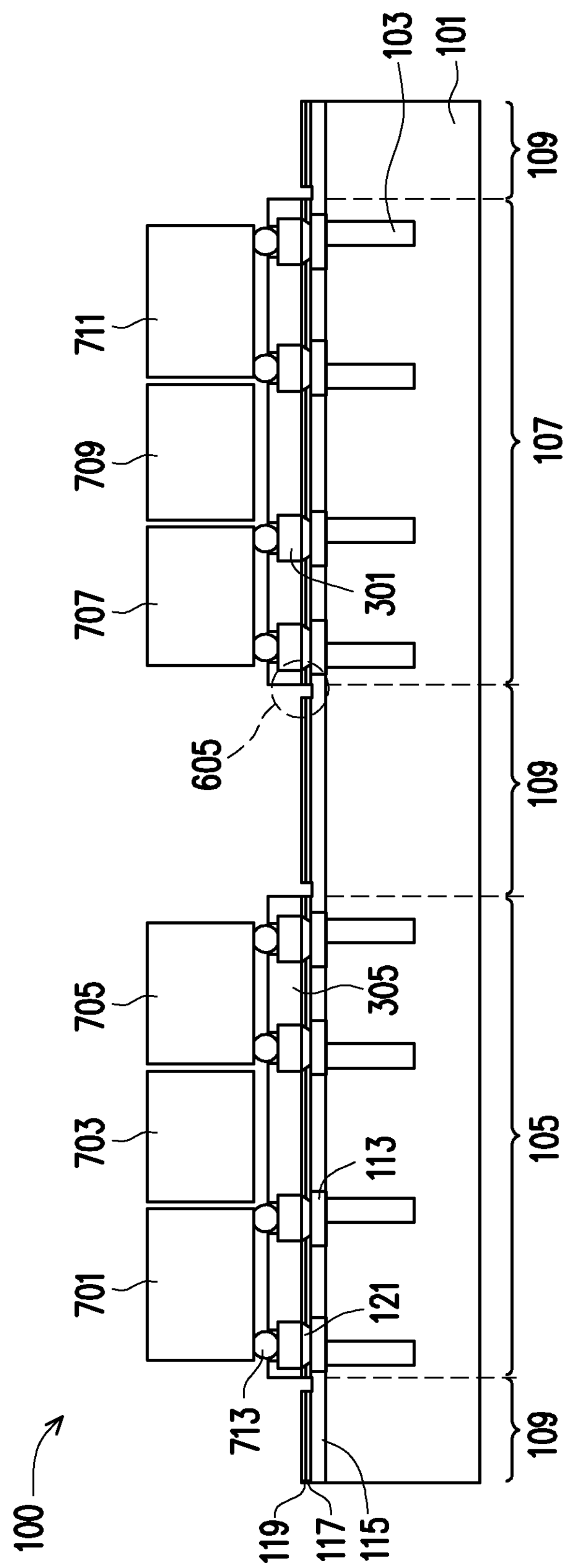
FIGS. 7A-7B illustrates a placement of semiconductor devices onto the interposer substrate in accordance with some embodiments.

FIG. 7A illustrates a placement and bonding of a first semiconductor device 701, a second semiconductor device 703, and a third semiconductor device 705 within the first interposer region 105. In an embodiment the first semiconductor device 701 may be a first die and comprise a first substrate, first active devices, first metallization layers, die contact pads, and first external connectors 713. The first substrate may comprise silicon, doped or undoped, or an active layer of a semiconductor-on-insulator (SOI) substrate. The first substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

The first active devices comprise a wide variety of active devices and passive devices such as transistors, diodes, capacitors, resistors, inductors and the like that may be used to generate the desired structural and functional requirements of the design for the first semiconductor device 701. The first active devices may be formed using any suitable methods either within or else on the first substrate.

The first metallization layers are formed over the first substrate and the first active devices and are designed to connect the various active devices to form functional circuitry. In an embodiment the first metallization layers are formed of alternating layers of dielectric and conductive material and may be formed through any suitable process (such as deposition, damascene, dual damascene, etc.). In an embodiment there may be layers of metallization separated from the first substrate by at least one interlayer dielectric layer (ILD), but the precise number of first metallization layers is dependent upon the design of the first semiconductor device 701.

The die contact pads may be formed over and in electrical contact with the first metallization layers. The die contact pads may comprise aluminum, but other materials, such as copper, may alternatively be used. The die contact pads may be formed using a deposition process, such as sputtering, to form a layer of material and portions of the layer of material may then be removed through a suitable process (such as photolithographic masking and etching) to form the die contact pads. However, any other suitable process may be utilized to form the die contact pads. The die contact pads may be formed to have a thickness of between about 0.5 μm and about 4 μm, such as about 1.45 μm.

The first external connectors 713 may be formed to provide conductive regions for contact between the die contact pads and the contact pads 301. In an embodiment the first external connectors 713 are solder balls formed using a ball drop method, such as a direct ball drop process. In another embodiment, the solder balls may be formed by initially forming a layer of tin through any suitable method such as evaporation, electroplating, printing, solder transfer, and then performing a reflow in order to shape the material into the desired bump shape.

Once the first semiconductor device 701 is formed, the first semiconductor device 701 is bonded to the contact pads 301 within the first interposer region 105. In an embodiment the first semiconductor device 701 is bonded by first aligning the first external connectors 713 to respective ones of the contact pads 301, and then physically contacting them before performing a reflow process. The reflow process physically and electrically connects the first semiconductor device 701 to the first interposer region 105. However, any suitable method for electrically and physically connecting the first semiconductor device 701 and the contact pads 301 may be utilized.

The second semiconductor device 703 and the third semiconductor device 705 may be similar to the first semiconductor device 701. For example, the second semiconductor device 703 and the third semiconductor device 705 may be semiconductor dies that are designed to work in conjunction with the first semiconductor device 701 or the first interposer region 105. However, the second semiconductor device 703 and the third semiconductor device 705 may also be different from the first semiconductor device 701.

Additionally, the second semiconductor device 703 and the third semiconductor device 705 may be bonded to the first interposer region 105 in a manner similar to the first semiconductor device 701. For example, the second semiconductor device 703 and the third semiconductor device 705 may be bonded to the first interposer region 105 using solder balls and a reflow process. However, the second semiconductor device 703 and the third semiconductor device 705 may also be bonded in a different fashion than the first semiconductor device 701.

FIG. 7A additionally illustrates a fourth semiconductor device 707, a fifth semiconductor device 709, and a sixth semiconductor device 711 bonded to the interposer substrate 101 within the second interposer region 107. In an embodiment the fourth semiconductor device 707, the fifth semiconductor device 709, and the sixth semiconductor device 711 may be similar to the first semiconductor device 701, the second semiconductor device 703, and the third semiconductor device 705. For example, the fourth semiconductor device 707, the fifth semiconductor device 709, and the sixth semiconductor device 711 may be semiconductor dies that are designed to work in conjunction with each other and with the second interposer region 107. However, the fourth semiconductor device 707, the fifth semiconductor device 709, and the sixth semiconductor device 711 may also be different from the first semiconductor device 701, the second semiconductor device 703, and the third semiconductor device 705.

Additionally, the fourth semiconductor device 707, the fifth semiconductor device 709, and the sixth semiconductor device 711 may be bonded to the second interposer region 107 in a manner similar to the first semiconductor device 701, the second semiconductor device 703, and the third semiconductor device 705. For example, the fourth semiconductor device 707, the fifth semiconductor device 709, and the sixth semiconductor device 711 may be bonded to the second interposer region 107 using solder balls and a reflow process. However, the fourth semiconductor device 707, the fifth semiconductor device 709, and the sixth semiconductor device 711 may also be bonded in a different fashion than the first semiconductor device 701, the second semiconductor device 703, and the third semiconductor device 705.

Figure 7B:
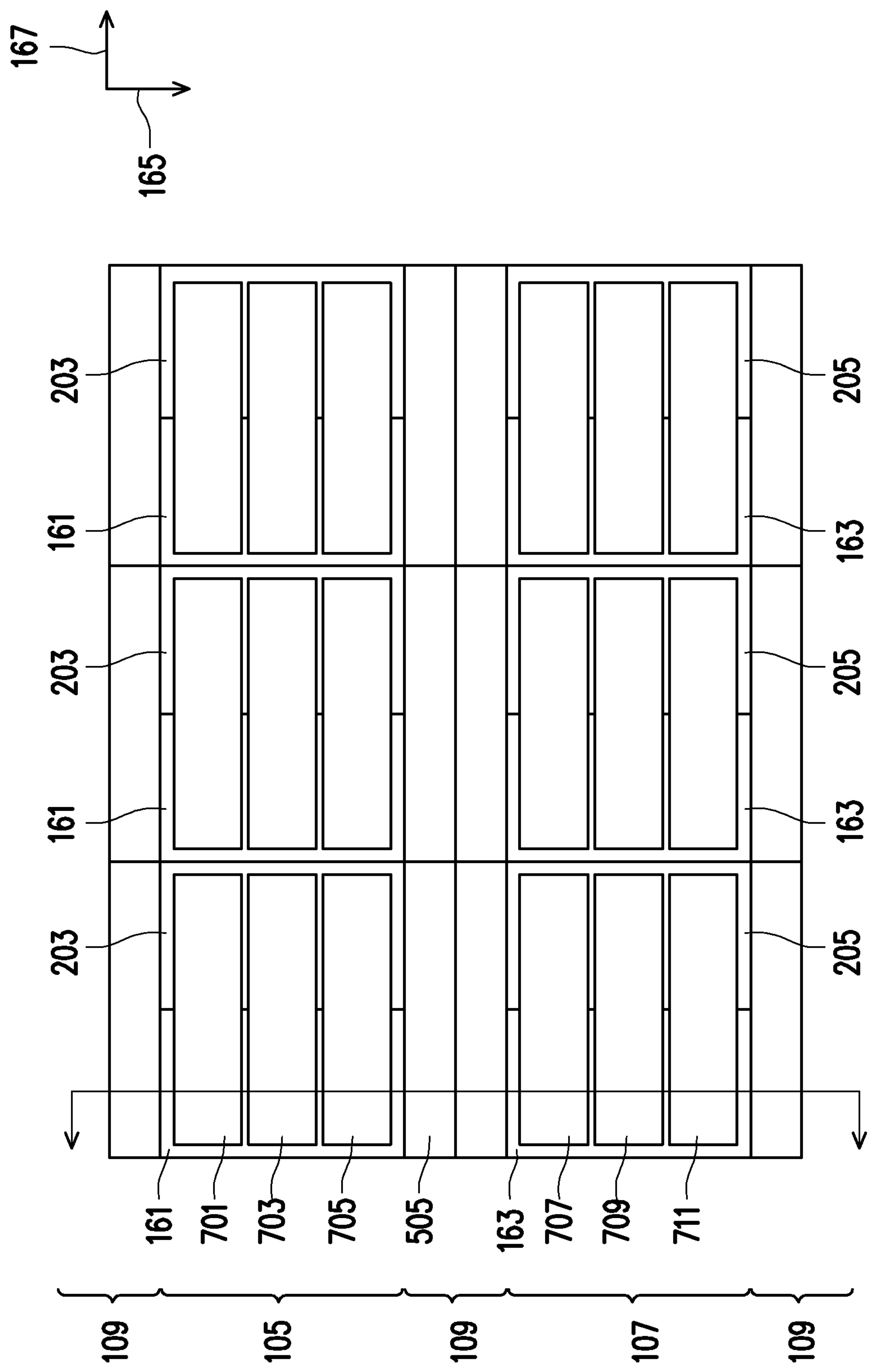

FIG. 7B illustrates a top down view of the first semiconductor device 701, the second semiconductor device 703, the third semiconductor device 705, the fourth semiconductor device 707, the fifth semiconductor device 709, and the sixth semiconductor device 711 attached to the first interposer region 105 and the second interposer region 107 along with the first exposure region 161, the second exposure region 163, the third exposure region 203, and the fourth exposure region 205. As can be seen, each of the first semiconductor device 701, the second semiconductor device 703, the third semiconductor device 705, the fourth semiconductor device 707, the fifth semiconductor device 709, and the sixth semiconductor device 711, span over the first exposure region 161 and the third exposure region 203 (within the first interposer region 105) or span over the second exposure region 163 and the fourth exposure region 205 (within the second interposer region 107). However, the first semiconductor device 701, the second semiconductor device 703, the third semiconductor device 705, the fourth semiconductor device 707, the fifth semiconductor device 709, and the sixth semiconductor device 711 do not extend over either the scribe regions 109 or over the overhang region.

Figure 8:
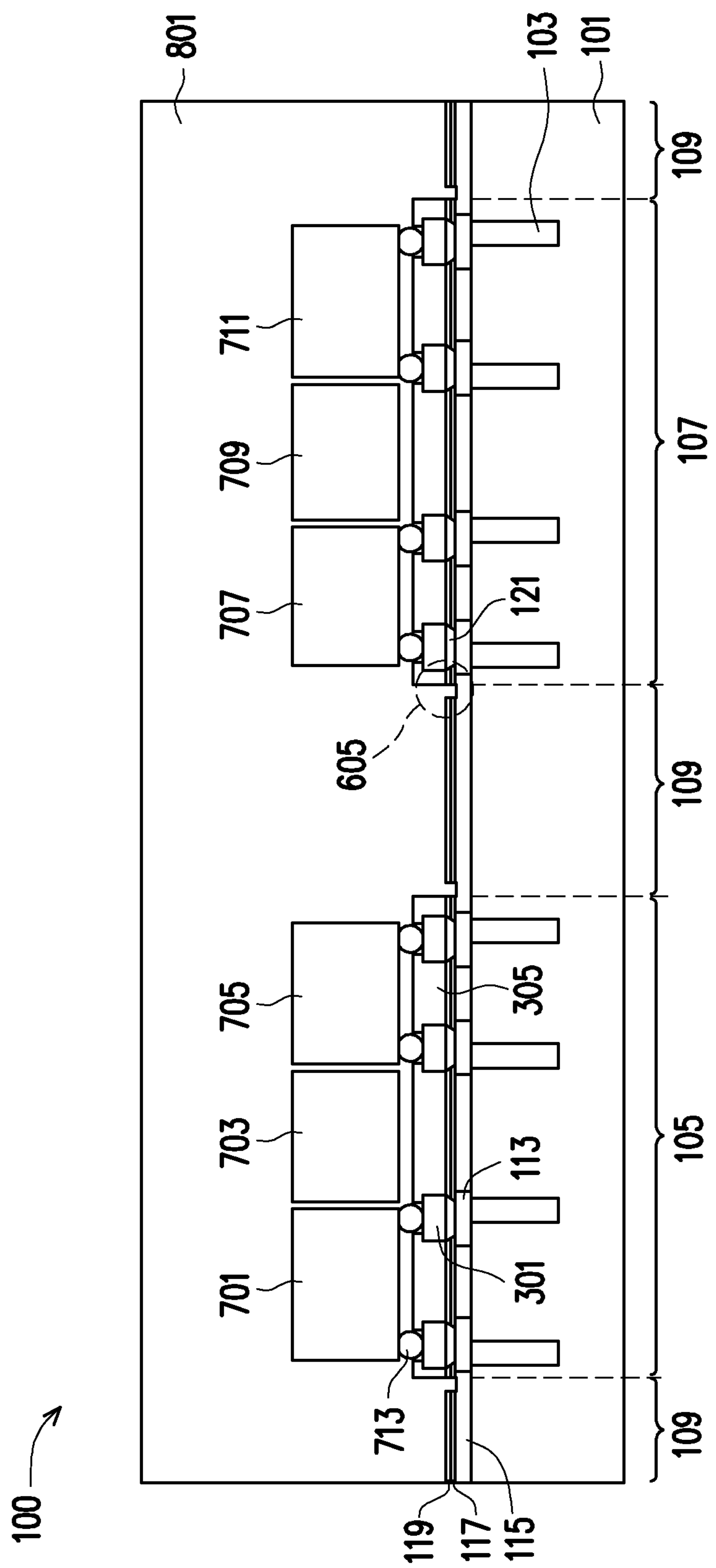
FIG. 8 illustrates an encapsulation in accordance with some embodiments.

FIG. 8 illustrates an encapsulation of the interposer substrate 101 and the first semiconductor device 701, the second semiconductor device 703, the third semiconductor device 705, the fourth semiconductor device 707, the fifth semiconductor device 709, and the sixth semiconductor device 711. The encapsulation may be performed in a molding device, which may comprise a top molding portion and a bottom molding portion separable from the top molding portion. When the top molding portion is lowered to be adjacent to the bottom molding portion, a molding cavity may be formed for the interposer substrate 101 and the first semiconductor device 701, the second semiconductor device 703, the third semiconductor device 705, the fourth semiconductor device 707, the fifth semiconductor device 709, and the sixth semiconductor device 711.

During the encapsulation process the top molding portion may be placed adjacent to the bottom molding portion, thereby enclosing the interposer substrate 101 and the first semiconductor device 701, the second semiconductor device 703, the third semiconductor device 705, the fourth semiconductor device 707, the fifth semiconductor device 709, and the sixth semiconductor device 711 within the molding cavity. Once enclosed, the top molding portion and the bottom molding portion may form an airtight seal in order to control the influx and outflux of gasses from the molding cavity. Once sealed, an encapsulant 801 may be placed within the molding cavity.

The encapsulant 801 may be an epoxy or a molding compound resin such as polyimide, PPS, PEEK, PES, a heat resistant crystal resin, combinations of these, or the like. The encapsulant 801 may be placed within the molding cavity prior to the alignment of the top molding portion and the bottom molding portion, or else may be injected into the molding cavity through an injection port, using compression molding, transfer molding, or the like.

Once the encapsulant 801 has been placed into the molding cavity such that the encapsulant 801 encapsulates the interposer substrate 101 and the first semiconductor device 701, the second semiconductor device 703, the third semiconductor device 705, the fourth semiconductor device 707, the fifth semiconductor device 709, and the sixth semiconductor device 711, the encapsulant 801 may be cured in order to harden the encapsulant for optimum protection. While the exact curing process is dependent at least in part on the particular material chosen for the encapsulant 801, in an embodiment in which molding compound is chosen as the encapsulant 801, the curing could occur through a process such as heating the encapsulant 801 to between about 100° C. and about 130° C., such as about 125° C. for about 60 sec to about 3000 sec, such as about 600 sec. Additionally, initiators and/or catalysts may be included within the encapsulant 801 to better control the curing process.

However, as one having ordinary skill in the art will recognize, the curing process described above is merely an exemplary process and is not meant to limit the current embodiments. Other curing processes, such as irradiation or even allowing the encapsulant to harden at ambient temperature, may alternatively be used. Any suitable curing process may be used, and all such processes are fully intended to be included within the scope of the embodiments discussed herein.

Figure 9:
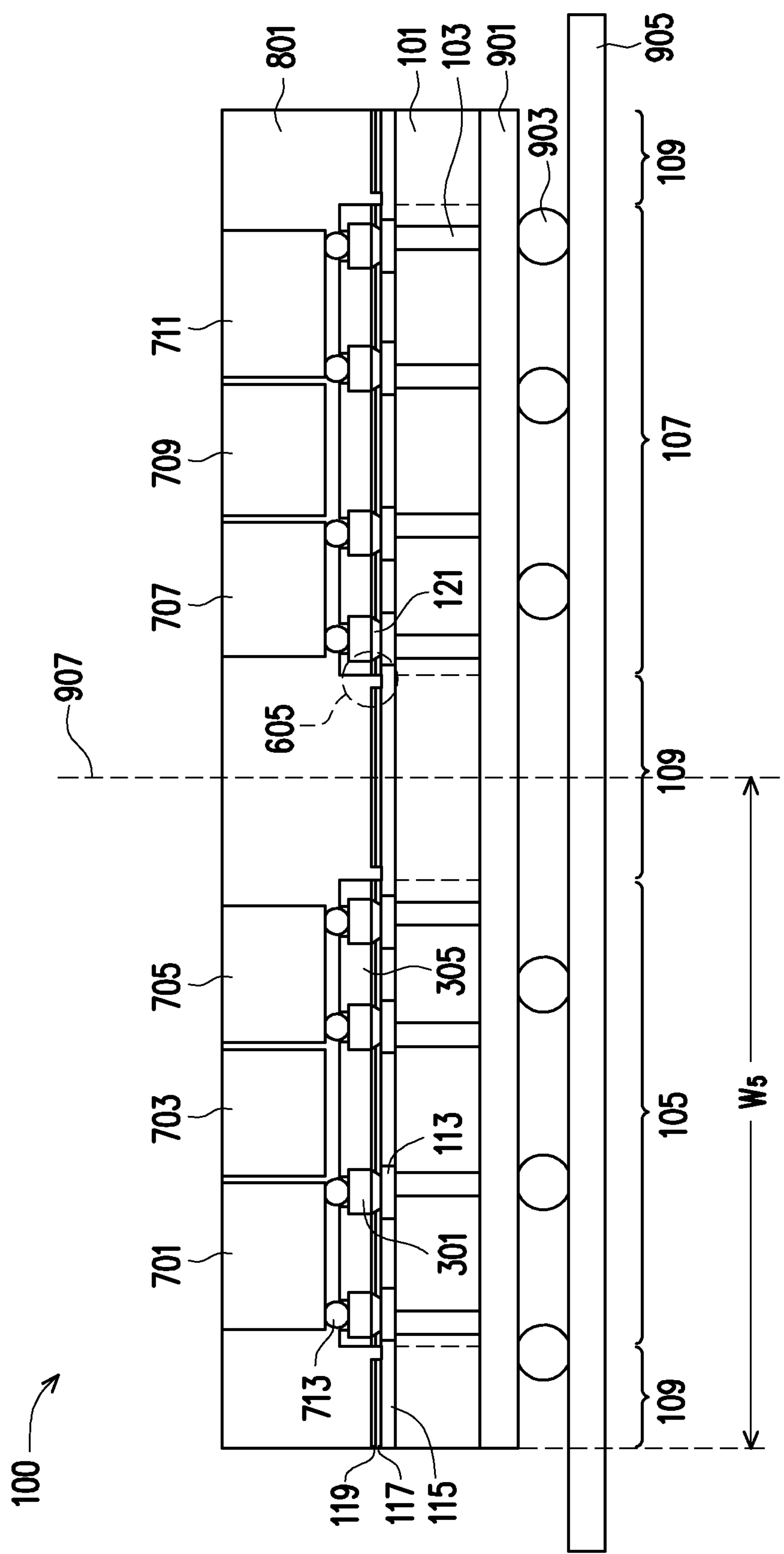
FIG. 9 illustrates a thinning of the encapsulant and the interposer substrate in accordance with some embodiments.

FIG. 9 illustrates a thinning of the encapsulant 801. The thinning may be performed, e.g., using a mechanical grinding or chemical mechanical polishing (CMP) process whereby chemical etchants and abrasives are utilized to react and grind away the encapsulant 801 so that the first semiconductor device 701, the second semiconductor device 703, the third semiconductor device 705, the fourth semiconductor device 707, the fifth semiconductor device 709, and the sixth semiconductor device 711 have been exposed. As such, the first semiconductor device 701, the second semiconductor device 703, the third semiconductor device 705, the fourth semiconductor device 707, the fifth semiconductor device 709, and the sixth semiconductor device 711 may have a planar surface that is also planar with the encapsulant 801.

FIG. 9 additionally illustrates a thinning of a second side of the interposer substrate 101 in order to expose the openings for the TSVs 103 and form the TSVs 103 from the conductive material that extends through the interposer substrate 101. In an embodiment, the thinning of the second side of the interposer substrate 101 may leave the TSVs 103 exposed. The thinning of the second side of the interposer substrate 101 may be performed by a planarization process such as CMP or etching.

Additionally, once the interposer substrate 101 has been thinned, a second redistribution layer 901 can be formed on the second side of the interposer substrate 101 and in electrical connection with the TSVs 103. In an embodiment the second redistribution layer 901 may be similar to the first redistribution layer 113 (described above with respect to FIG. 1A) and may be formed in a similar fashion. Additionally, second external connectors 903, such as solder balls, may be utilized to connect the second redistribution layer 901 to a second substrate 905, such as a printed circuit board or other substrate.

If desired, the interposer substrate 101 may be singulated after bonding, such as being singulated along the dashed line labeled 907. In an embodiment the interposer substrate 101 is singulated along the dashed line 907 using, e.g., a die saw, a laser, one or more etching processes, or other device in order to separate the interposer substrate 101.

By utilizing the extra mask to pattern the scribe regions 109, the size of the interposer substrate 101 after singulation can be extended beyond the limits of the single reticle exposure regions. As such, the interposer die size may be formed with a fifth width $W_5$ of about 34.3 mm. However, any suitable width may be utilized.

Figure 10:
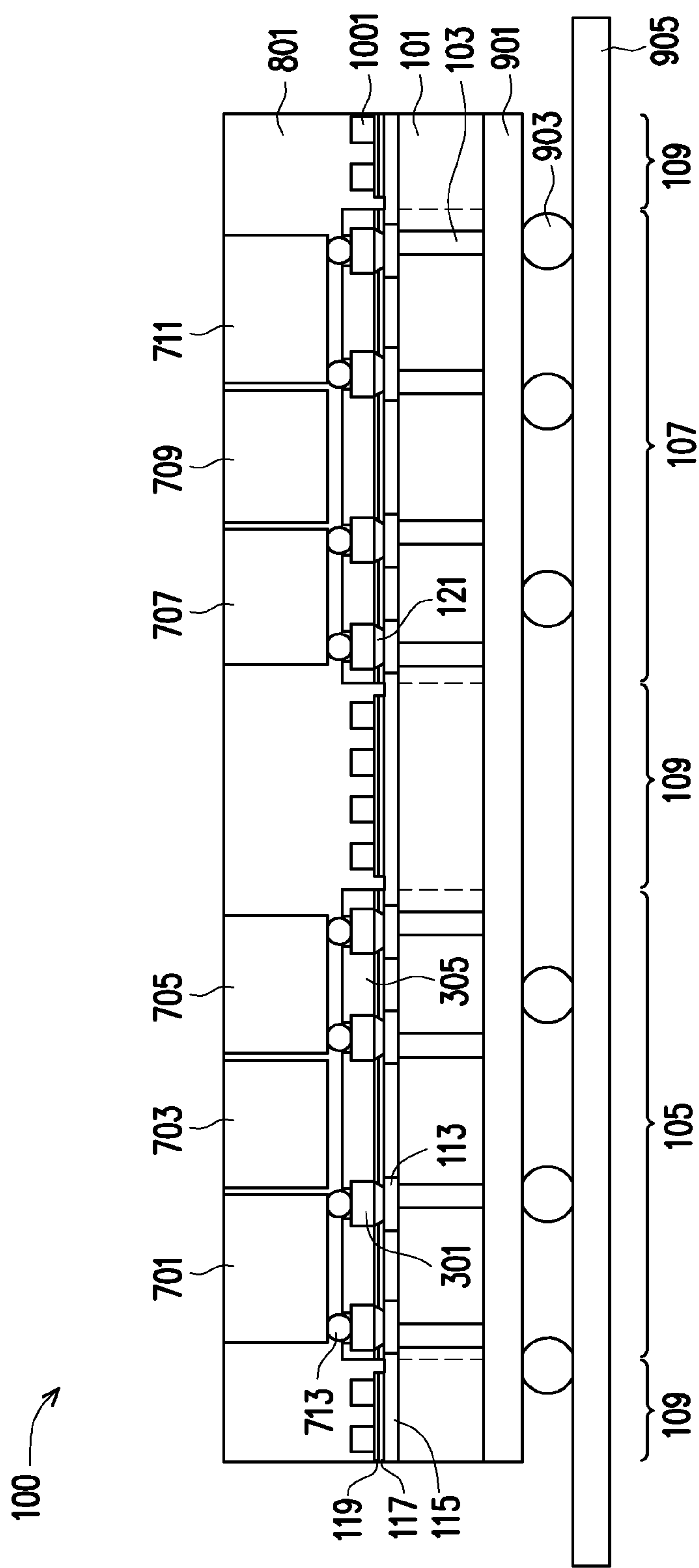
FIG. 10 illustrates an embodiment with a dummy pattern in accordance with some embodiments.

FIG. 10 illustrates another embodiment in which the first portion 303 of the conductive layer 123 within the scribe regions 109 is not fully removed. Rather, the first portion 303 of the conductive layer 123 within the scribe regions 109 is patterned into a dummy pattern 1001. By patterning the first portion 303 of the conductive layer 123, the negative effects such as wafer arcing of the presence of the conductive layer 123 within the scribe regions 109 may be reduced or eliminated while still retaining a dummy pattern 1001 for structural support.

Figure 11:
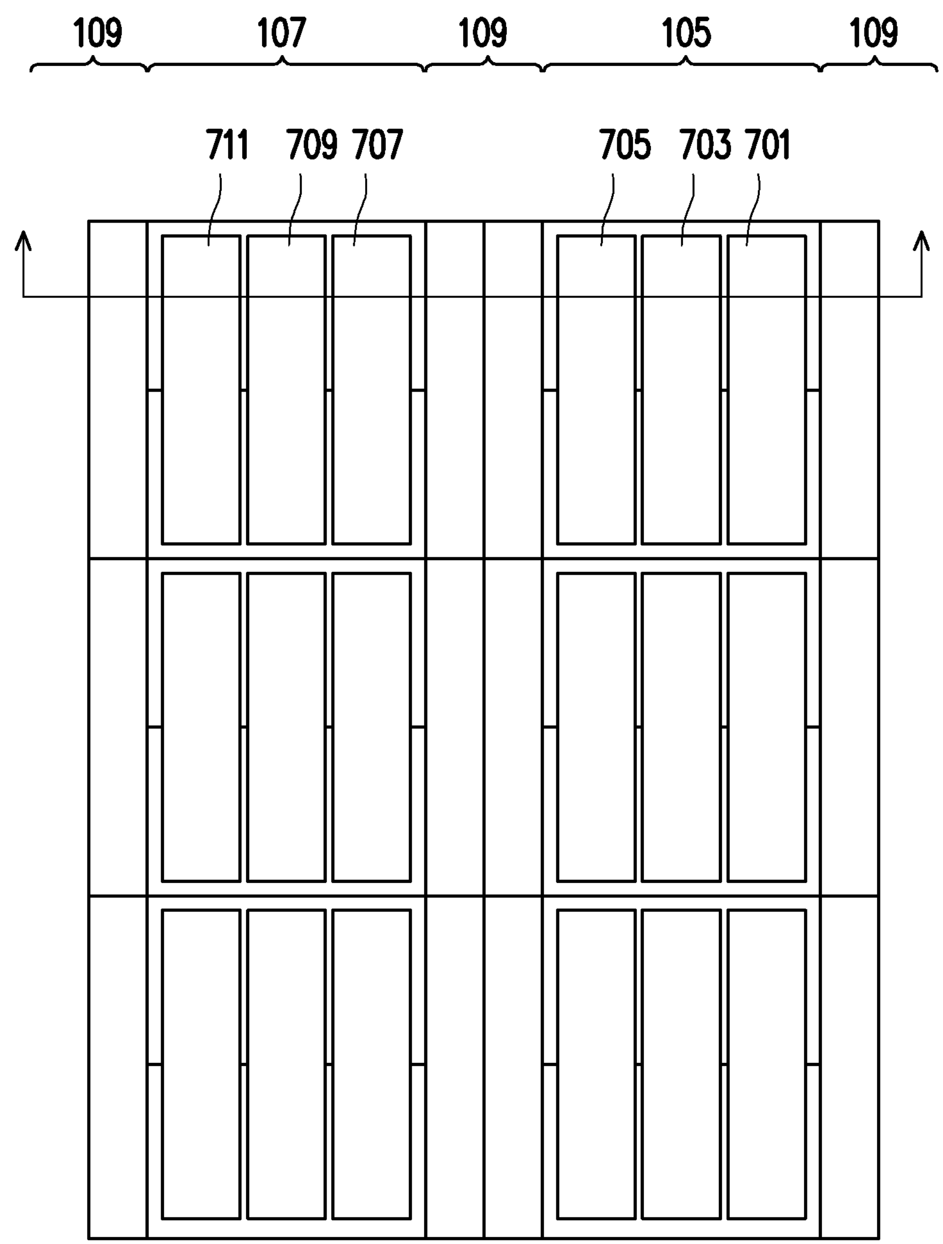
FIG. 11 illustrates a vertical overhang in accordance with some embodiments.

FIG. 11 illustrates that, while the overhang is illustrated in the previous embodiments as being in a particular direction, the embodiments are not so limited. Rather, the overhang may be formed over any suitable edge of the first interposer region 105 or the second interposer region 107. All such combinations are fully intended to be included within the scope of the embodiments.

In an embodiment a method of manufacturing a semiconductor device includes: exposing a first region over an interposer substrate with a first photolithographic mask to form a first exposure region; exposing a second region over the interposer substrate with a second photolithographic mask to form a second exposure region; and exposing a scribe region over the interposer substrate with a third photolithographic mask different from the first photolithographic mask and the second photolithographic mask to form a third exposure region between the first exposure region and the second exposure region, wherein the third exposure region overlaps the first exposure region and the second exposure region. In an embodiment, the third exposure region overlaps the first exposure region by about 2.5 μm. In an embodiment, the scribe region has a width of about 1400 μm. In an embodiment, the method further includes removing at least a portion of a conductive material from the scribe region after the exposing the scribe region. In an embodiment, the removing the portion of the conductive material removes all of the conductive material. In an embodiment, the removing the portion of the conductive material forms a dummy pattern of the conductive material. In an embodiment, the removing the portion of the conductive material forms an opening within a portion of a dielectric material between the conductive material and the first exposure region.

In another embodiment a method of manufacturing a semiconductor device includes: imaging a first region of an interposer substrate with a first photolithographic mask; imaging a second region of the interposer substrate with the first photolithographic mask; imaging a third region of the interposer substrate with a second photolithographic mask different from the first photolithographic mask, wherein the third region extends between the first region and the second region and into both the first region and the second region, wherein the third region comprises a conductive material and a dielectric material underlying the conductive material, the dielectric material having a first portion exposed by the conductive material; and removing at least a portion of the conductive material from the third region after the imaging the third region, wherein the removing the conductive material forms an opening within the first portion of the dielectric material. In an embodiment, the dielectric material comprises: a first layer of silicon oxide; a first layer of silicon nitride overlying the first layer of silicon oxide; and a first layer of silicon oxide overlying the first layer of silicon nitride. In an embodiment, the method further includes singulating the first region of the interposer substrate from the second region of the interposer substrate, wherein after the singulating the interposer substrate extends to a first width, the first width being larger than a maximum exposure limit of the first photolithographic mask. In an embodiment, the third region extends into the first region a distance of 2.5 μm. In an embodiment, the method further includes attaching a first semiconductor device, a second semiconductor device, and a third semiconductor device to the first region of the interposer substrate. In an embodiment, the method further includes encapsulating the first semiconductor device, the second semiconductor device, and the third semiconductor device. In an embodiment, the removing the portion of the conductive material from the third region comprises removing all of the conductive material from the third region.

In another embodiment a semiconductor device includes an interposer substrate; a redistribution layer over the interposer substrate; a first dielectric layer over the redistribution layer; a second dielectric layer over the first dielectric layer; contact pads located over the second dielectric layer; and a passivation layer over the contact pads, wherein the first dielectric layer has a first sidewall aligned with a second sidewall of the second dielectric layer, and wherein the first dielectric layer has a third sidewall aligned with a fourth sidewall of the second dielectric layer, wherein a distance between the first sidewall to the second sidewall is larger than an exposure limit of an exposure mask. In an embodiment the first dielectric layer comprises silicon oxide and the second dielectric layer comprises silicon nitride. In an embodiment the interposer substrate comprises a die attach region and wherein the first sidewall and the second sidewall are outside of the die attach region in a top down view. In an embodiment at least three semiconductor devices are attached to the interposer substrate within the die attach region. In an embodiment the semiconductor device further includes a dummy pattern in a scribe region adjacent to the die attach region, wherein the dummy pattern has a first thickness and a first one of the contact pads has the first thickness. In an embodiment the semiconductor device further includes through substrate vias extending through the interposer substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:

a contact pad over a first dielectric layer over an interposer substrate; and a passivation layer over a first portion of the first dielectric layer, wherein a sidewall of the passivation layer is aligned with a first sidewall of the first dielectric layer and wherein the first dielectric layer has a second sidewall facing the first sidewall, the second sidewall being misaligned from the passivation layer, wherein the first portion of the first dielectric layer is in physical contact with the passivation layer where the sidewall of the passivation layer is aligned with the first sidewall of the first dielectric layer, wherein each portion of the dielectric layer is located outside of a region between the first sidewall of the first dielectric layer and the second sidewall of the dielectric layer.

2. The semiconductor device of claim 1, further comprising a second dielectric layer between the first dielectric layer and the interposer substrate, the second dielectric layer having a third sidewall aligned with the first sidewall and a fourth sidewall aligned with the second sidewall.

3. The semiconductor device of claim 2, further comprising a third dielectric layer between the second dielectric layer and the interposer substrate, the third dielectric layer having a fifth sidewall aligned with the first sidewall and a sixth sidewall aligned with the second sidewall.

4. The semiconductor device of claim 1, further comprising a semiconductor die electrically connected to contact pad through the passivation layer.

5. The semiconductor device of claim 1, further comprising an encapsulant in physical contact with the first sidewall and the second sidewall.

6. The semiconductor device of claim 5, wherein the encapsulant is in physical contact with at least one conductive element located over the first dielectric layer, the at least one conductive element having a sidewall facing the passivation layer.

7. The semiconductor device of claim 1, further comprising through substrate vias extending through the interposer substrate.

8. A semiconductor device comprising:

a first dielectric layer over an interposer substrate, the first dielectric layer having a first sidewall and a second sidewall facing the first sidewall;

a second dielectric layer having a third sidewall aligned with the first sidewall and a fourth sidewall aligned with the second sidewall, wherein the third sidewall and the first sidewall form a first continuous planar sidewall and the fourth sidewall and second sidewall form a second continuous planar sidewall; and a passivation layer with a fifth sidewall aligned with the second sidewall and the fourth sidewall, wherein the first sidewall is misaligned from the passivation layer.

9. The semiconductor device of claim 8, further comprising a third dielectric layer with a sixth sidewall aligned with the first sidewall and a seventh sidewall aligned with the second sidewall, a surface of the third dielectric layer extending between the sixth sidewall and the seventh sidewall.

10. The semiconductor device of claim 8, further comprising through interposer vias extending through the interposer substrate.

11. The semiconductor device of claim 8, wherein the first sidewall is separated from the second sidewall by a distance of about 1.5 μm.

12. The semiconductor device of claim 8, further comprising an encapsulant in physical contact with each of the first sidewall, the second sidewall, the third sidewall and the fourth sidewall.

13. The semiconductor device of claim 8, further comprising at least three semiconductor dies electrically connected to the interposer substrate through the passivation layer.

14. The semiconductor device of claim 8, a photoresist material with a sixth sidewall aligned with the fifth sidewall, the photoresist material not located over the first dielectric layer adjacent to the first sidewall.

15. A semiconductor device comprising:

an interposer substrate;

a redistribution layer over the interposer substrate;

a first dielectric layer over the redistribution layer;

a second dielectric layer over the first dielectric layer;

contact pads located over the second dielectric layer; and a passivation layer over the contact pads, wherein the first dielectric layer has a first sidewall aligned with and in contact with a second sidewall of the second dielectric layer, and wherein the first dielectric layer has a third sidewall aligned with and in contact with a fourth sidewall of the second dielectric layer, wherein a distance between the first sidewall to the second sidewall is larger than an exposure limit of an exposure mask.

16. The semiconductor device of claim 15, wherein the first dielectric layer comprises silicon oxide and the second dielectric layer comprises silicon nitride.

17. The semiconductor device of claim 15, wherein the interposer substrate comprises a die attach region and wherein the first sidewall and the second sidewall are outside of the die attach region in a top down view.

18. The semiconductor device of claim 17, wherein at least three semiconductor devices are attached to the interposer substrate within the die attach region.

19. The semiconductor device of claim 17, further comprising a dummy pattern in a scribe region adjacent to the die attach region, wherein the dummy pattern has a first thickness and a first one of the contact pads has the first thickness.

20. The semiconductor device of claim 15, further comprising through substrate vias extending through the interposer substrate.

* * * * *